(12) United States Patent
Nishimaki et al.

(10) Patent No.: US 9,244,353 B2
(45) Date of Patent: Jan. 26, 2016

(54) RESIST UNDERLAYER FILM FORMING COMPOSITION

(71) Applicant: NISSAN CHEMICAL INDUSTRIES, LTD., Tokyo (JP)

(72) Inventors: Hirokazu Nishimaki, Toyama (JP); Keisuke Hashimoto, Toyama (JP); Tetsuya Shinjo, Toyama (JP); Takafumi Endo, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/420,442

(22) PCT Filed: Aug. 5, 2013

(86) PCT No.: PCT/JP2013/071134
§ 371 (c)(1),
(2) Date: Feb. 9, 2015

(87) PCT Pub. No.: WO2014/024836
PCT Pub. Date: Feb. 13, 2014

(65) Prior Publication Data
US 2015/0212418 A1    Jul. 30, 2015

(30) Foreign Application Priority Data
Aug. 10, 2012    (JP) .................................. 2012-178290

(51) Int. Cl.
| | | |
|---|---|---|
| *G03F 7/11* | (2006.01) |
| *G03F 7/16* | (2006.01) |
| *H01L 21/3213* | (2006.01) |
| *C08G 8/04* | (2006.01) |
| *C09D 161/12* | (2006.01) |
| *G03F 7/09* | (2006.01) |
| *H01L 21/306* | (2006.01) |
| *H01L 21/308* | (2006.01) |
| *H01L 21/027* | (2006.01) |
| *H01L 21/02* | (2006.01) |

(52) U.S. Cl.
CPC .. *G03F 7/11* (2013.01); *C08G 8/04* (2013.01); *C09D 161/12* (2013.01); *G03F 7/094* (2013.01); *G03F 7/16* (2013.01); *H01L 21/3081* (2013.01); *H01L 21/3086* (2013.01); *H01L 21/30604* (2013.01); *H01L 21/32139* (2013.01); *H01L 21/0274* (2013.01); *H01L 21/02112* (2013.01)

(58) Field of Classification Search
CPC ............. G03F 7/094; G03F 7/11; G03F 7/16; G03F 7/168; H01L 21/011; H01L 21/321139; H01L 21/0271; H01L 21/0273; H01L 21/0274; H01L 21/0211; H01L 21/02742
USPC ........... 430/311, 271.1, 322, 273.1, 325, 329, 430/330, 331
See application file for complete search history.

(56) References Cited

U.S. PATENT DOCUMENTS

| | | | |
|---|---|---|---|
| 7,662,718 B2 * | 2/2010 | Abatchev et al. ............. 438/689 |
| 8,652,757 B2 * | 2/2014 | Hatakeyama et al. ...... 430/271.1 |
| 8,663,898 B2 * | 3/2014 | Ogihara et al. ............ 430/270.1 |
| 8,852,844 B2 * | 10/2014 | Ogihara et al. ............ 430/270.1 |
| 2008/0305441 A1 | 12/2008 | Yoon et al. |
| 2012/0108071 A1 | 5/2012 | Ogihara et al. |
| 2012/0171868 A1 * | 7/2012 | Ogihara et al. ............... 438/703 |
| 2012/0322010 A1 * | 12/2012 | Paulasaari ..................... 430/325 |
| 2014/0335692 A1 * | 11/2014 | Nonaka et al. ................ 438/656 |

FOREIGN PATENT DOCUMENTS

| | | |
|---|---|---|
| JP | 2006-259249 A | 9/2006 |
| JP | 2007-017976 A | 1/2007 |
| JP | 2007-316282 A | 12/2007 |
| JP | 2010-117629 A | 5/2010 |
| JP | 2010-528334 A | 8/2010 |
| JP | 2010-529499 A | 8/2010 |
| JP | 2012-098431 A | 5/2012 |

OTHER PUBLICATIONS

Aug. 27, 2013 International Search Report issued in International Application No. PCT/JP2013/071134.
Aug. 27, 2013 Written Opinion issued in International Application No. PCT/JP2013/071134.

* cited by examiner

*Primary Examiner* — Amanda C Walke
(74) *Attorney, Agent, or Firm* — Oliff PLC

(57) ABSTRACT

A resist underlayer film forming composition including: a polymer having any one or more repeating structural units of Formulas (1a), (1b), and (1c):

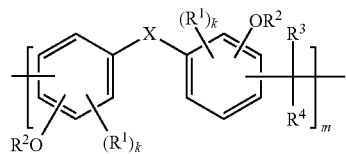
(1a)

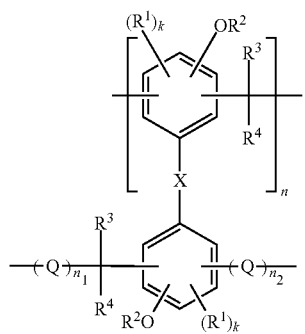
(1b)

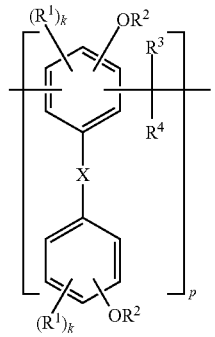
(1c)

two R1s are each independently alkyl group, alkenyl group, aromatic hydrocarbon group, halogen atom, nitro group, or an amino group, two R2s are each independently hydrogen atom, alkyl group, alkenyl group, acetal group, acyl group, or glycidyl group, R3 is aromatic hydrocarbon group optionally having a substituent, R4 is hydrogen atom, phenyl group, or naphthyl group, in (1b), groups of two R3s and atoms or groups of two R4s are optionally different from each other, two "k"s are each independently 0 or 1, m is integer of 3 to 500, n, n1, and n2 are an integer of 2 to 500, p is integer of 3 to 500, X is a single bond or hetero atom, and two Qs are each independently a structural unit; and solvent.

5 Claims, 7 Drawing Sheets

RESIST UNDERLAYER FILM FORMING COMPOSITION

TECHNICAL FIELD

The present invention relates to a resist underlayer film forming composition for a lithography process. In particular, the present invention relates to a composition for forming a resist underlayer film having etching resistance when the resist underlayer film is used as a mask material and having embedding property relative to a surface having a level difference, a concave part and/or a convex part.

BACKGROUND ART

In the production of semiconductor devices, fine processing is performed by a lithography process. In the lithography process, such an issue is known that when a resist layer on a substrate is exposed to light using an ultraviolet laser such as a KrF excimer laser or an ArF excimer laser, due to the influence of a standing wave generated caused by the reflection of the ultraviolet laser on the surface of the substrate, a resist pattern having a desired shape cannot be formed. For solving the issue, it is adopted to provide a resist underlayer film (an anti-reflective coating) between the substrate and the resist layer. It is known that in a composition for forming the resist underlayer film, a novolac resin is used. For example, Patent Document 1 and Patent Document 2 describe a photoresist underlayer film forming material containing a resin having a repeating unit formed by converting a compound having a bisphenol group into novolac. Further, Patent Document 3 describes a composition for an anti-reflective coating that contains a polymer having in the backbone of the polymer, an aromatic ring in which three or more rings are fused and can be spin-coated. However, in Patent Documents 1 to 3, there is neither disclosed nor suggested a resist underlayer film forming composition containing a polymer having the fused aromatic ring in a side chain thereof.

There is also known a lithography process in which due to the thinning of the resist layer that is required according to the miniaturization of a resist pattern, at least two layers of resist underlayer film are formed and these resist underlayer films are used as a mask material. Examples of the material for forming the at least two layers include organic resins (for example, an acrylic resin and a novolac resin), silicone resins (for example, an organopolysiloxane), and inorganic silicon compounds (for example, SiON and $SiO_2$). When the dry etching is performed using as a mask, a pattern formed from the organic resin layer, the pattern is necessary to have etching resistance against an etching gas (for example, a fluorocarbon). As a composition for forming such an organic resin layer, for example, Patent Document 4 discloses a composition containing a polymer containing a heterocyclic aromatic moiety.

PRIOR ART DOCUMENTS

Patent Documents

Patent Document 1: Japanese Patent Application Publication No. 2006-259249 (JP 2006-259249 A)
Patent Document 2: Japanese Patent Application Publication No. 2007-316282 (JP 2007-316282 A)
Patent Document 3: Japanese Translation of PCT International Application No. 2010-528334 (JP 2010-528334 T)
Patent Document 4: Japanese Patent Application Publication No. 2007-017976 (JP 2007-017976 A)

SUMMARY OF THE INVENTION

Problem to be Solved by the Invention

It is an object of the present invention to provide a composition for forming a resist underlayer film having etching resistance against an etching gas such as a fluorocarbon and having embedding property relative to a surface having a level difference, a concave part and/or a convex part.

Means for Solving the Problem

A first aspect of the present invention is a resist underlayer film forming composition comprising: a polymer having any one or two or more of repeating structural units of Formula (1a), Formula (1b), and Formula (1c):

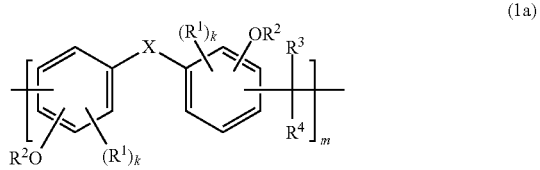

(1a)

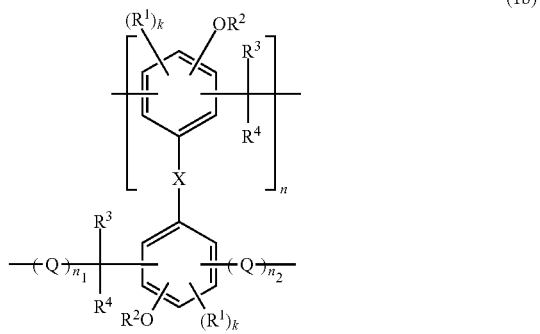

(1b)

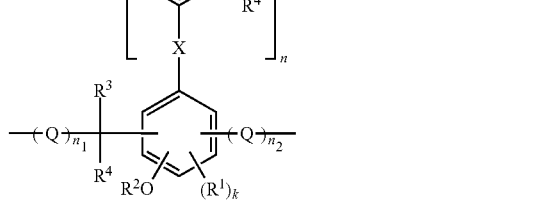

(1c)

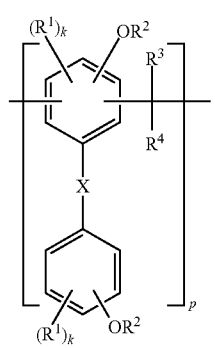

[in the formulae, two $R^1$s are each independently a $C_{1-10}$ alkyl group, a $C_{2-6}$ alkenyl group, an aromatic hydrocarbon group, a halogen atom, a nitro group, or an amino group, two $R^2$s are each independently a hydrogen atom, a $C_{1-10}$ alkyl group, a $C_{2-6}$ alkenyl group, an acetal group, an acyl group, or a glycidyl group, $R^3$ is an aromatic hydrocarbon group optionally having a substituent, $R^4$ is a hydrogen atom, a phenyl group, or a naphthyl group, when $R^3$ and $R^4$ that are bonded to the same carbon atom are individually a phenyl group, $R^3$ and $R^4$ are optionally bonded with each other to form a fluorene ring; in Formula (1b), groups of two $R^3$s are optionally different from each other, atoms or groups of two $R^4$s are optionally different from each other, two "k"s are each independently 0 or 1, m is an integer of 3 to 500, n, $n_1$, and $n_2$ are an integer of 2 to 500, p is an integer of 3 to 500, X is a single bond or a hetero atom, and two Qs are each independently a structural unit of Formula (2):

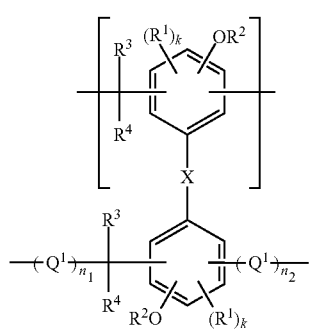

(where two $R^1$s, two $R^2$s, two $R^3$s, two $R^4$s, two "k"s, $n_1$, $n_2$, and X are the same as defined in Formula (1b), and two $Q^1$s are each independently a structural unit of Formula (2))]; and a solvent.

When X is a single bond, two benzene rings in Formula (1a), Formula (1b), or Formula (1c) are directly bonded to each other through the single bond to form a biphenyl structure. When X is a hetero atom, the hetero atom is an atom other than a carbon atom and a hydrogen atom and is an atom capable of forming a divalent group, and examples of the hetero atom include a sulfur atom and an oxygen atom. When $R^1$ is a halogen atom, examples of the halogen atom include a chlorine atom and a bromine atom. The aromatic ring of the aromatic hydrocarbon group may be any one of a monocyclic ring, a polycyclic ring (including a bicyclic ring), and a heterocyclic ring and examples thereof include a phenyl group, a biphenyl group, a naphthyl group, an anthryl group, a pyrenyl group, a thienyl group, and a pyridyl group. The aromatic hydrocarbon group of $R^3$ optionally having a substituent is, from the viewpoint of etching resistance and embedding property, preferably a phenyl group, a naphthyl group, an anthryl group, or a pyrenyl group. Then, examples of the substituent of the aromatic hydrocarbon group include a methoxy group and an aldehyde group.

The resist underlayer film forming composition of the present invention may further contain as an optional component, at least one of a cross-linking agent, an acidic compound, a thermoacid generator, and a surfactant.

A second aspect of the present invention is a production method of a semiconductor device comprising: forming a first resist underlayer film by applying the resist underlayer film forming composition of the present invention onto a surface having a level difference, a concave part and/or a convex part and baking the composition; forming an organopolysiloxane film as a second resist underlayer film on the first resist underlayer film; forming a resist pattern on the second resist underlayer film; etching the second resist underlayer film using the resist pattern as a mask; etching the first resist underlayer film using a pattern of the etched second resist underlayer film as a mask; and etching the surface having a level difference, a concave part and/or a convex part using a pattern of the etched first resist underlayer film as a mask.

Effects of the Invention

The resist underlayer film formed using the resist underlayer film forming composition of the present invention has etching resistance against an etching gas such as a fluorocarbon and has excellent embedding property relative to a surface having a concave part and/or a convex part.

MODES FOR CARRYING OUT THE INVENTION

Figure 1:
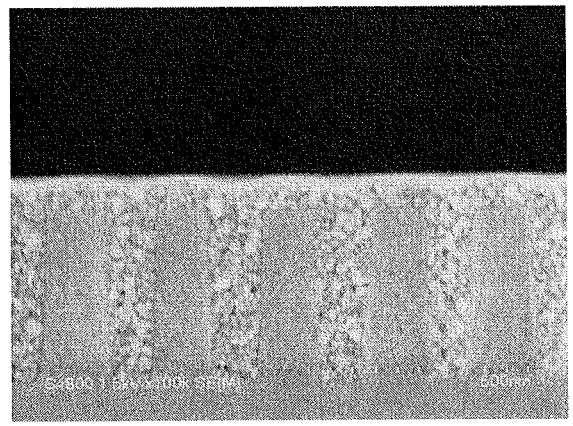
FIG. 1 is a cross-sectional SEM photograph showing a result of an embedding test using a resist underlayer film forming composition prepared in Example 1.
Figure 2:
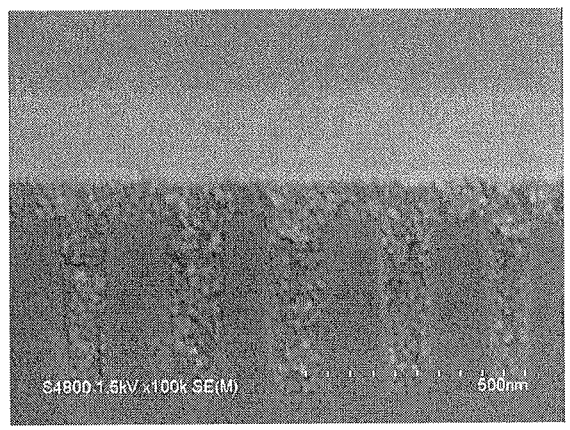
FIG. 2 is a cross-sectional SEM photograph showing a result of an embedding test using a resist underlayer film forming composition prepared in Example 2.
Figure 3:
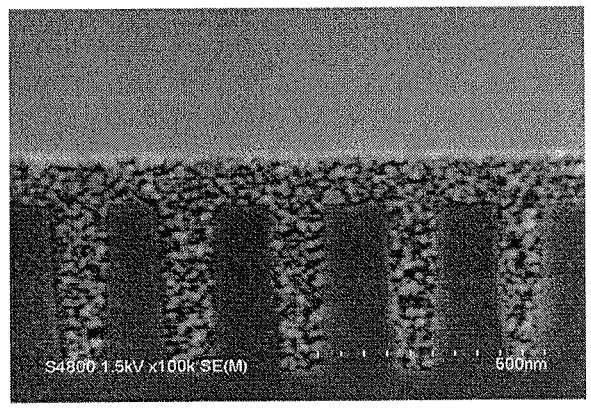
FIG. 3 is a cross-sectional SEM photograph showing a result of an embedding test using a resist underlayer film forming composition prepared in Example 3.
Figure 4:
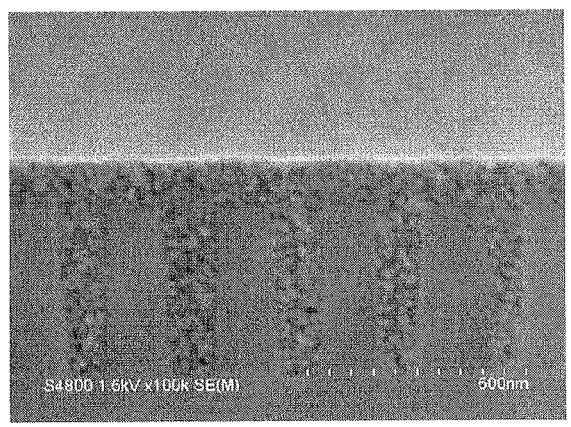
FIG. 4 is a cross-sectional SEM photograph showing a result of an embedding test using a resist underlayer film forming composition prepared in Example 4.
Figure 5:
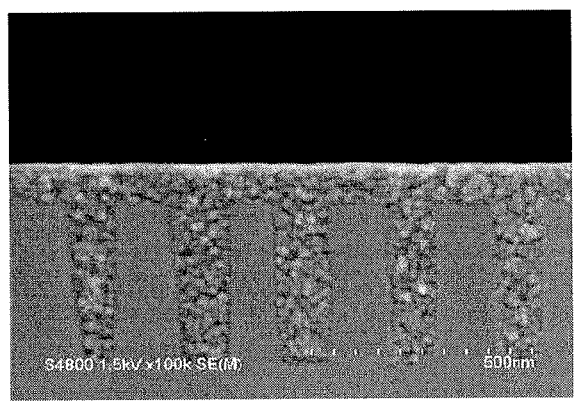
FIG. 5 is a cross-sectional SEM photograph showing a result of an embedding test using a resist underlayer film forming composition prepared in Example 5.
Figure 6:
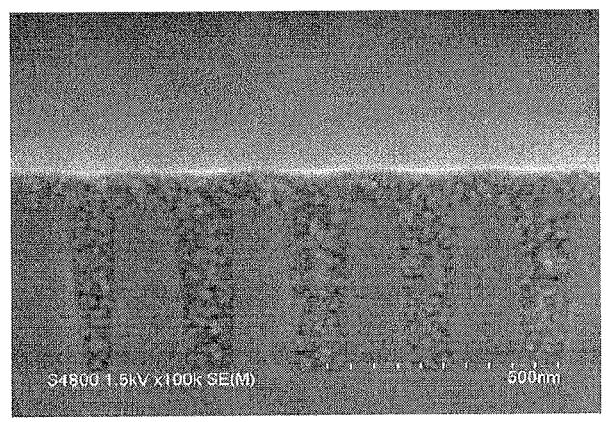
FIG. 6 is a cross-sectional SEM photograph showing a result of an embedding test using a resist underlayer film forming composition prepared in Example 6.
Figure 7:
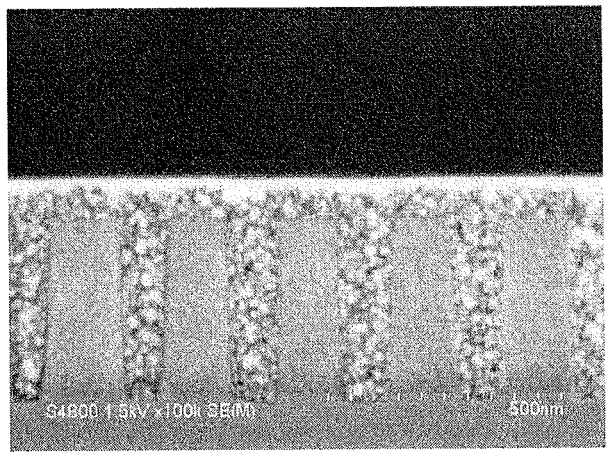
FIG. 7 is a cross-sectional SEM photograph showing a result of an embedding test using a resist underlayer film forming composition prepared in Example 7.
Figure 8:
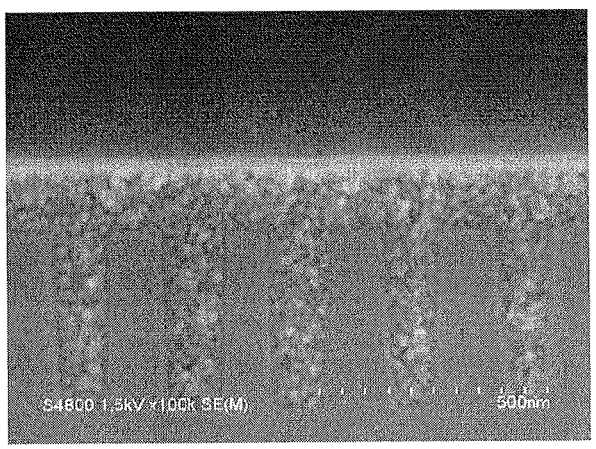
FIG. 8 is a cross-sectional SEM photograph showing a result of an embedding test using a resist underlayer film forming composition prepared in Example 8.
Figure 9:
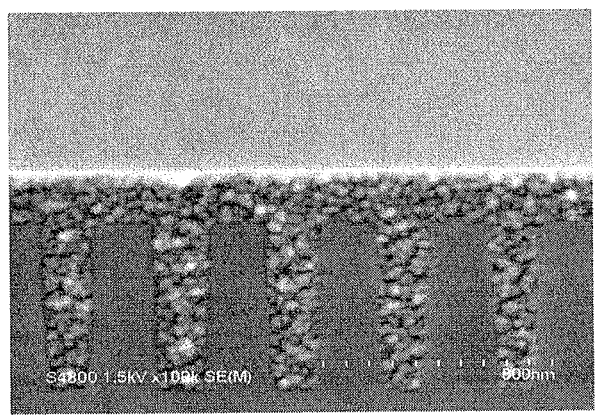
FIG. 9 is a cross-sectional SEM photograph showing a result of an embedding test using a resist underlayer film forming composition prepared in Example 9.
Figure 10:
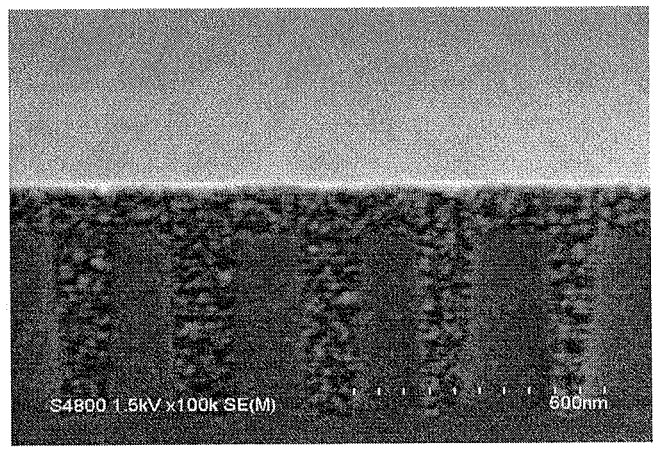
FIG. 10 is a cross-sectional SEM photograph showing a result of an embedding test using a resist underlayer film forming composition prepared in Example 10.
Figure 11:
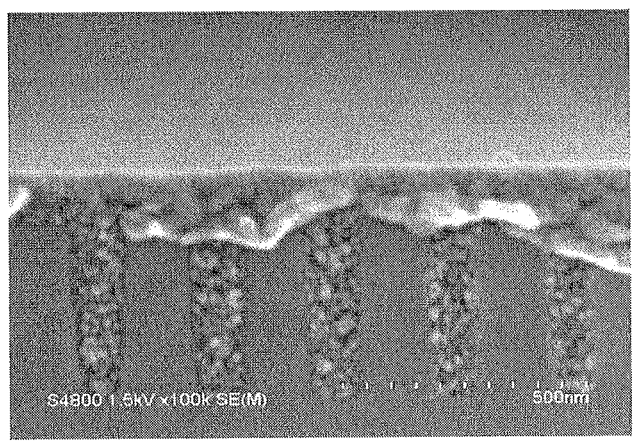
FIG. 11 is a cross-sectional SEM photograph showing a result of an embedding test using a resist underlayer film forming composition prepared in Example 11.
Figure 12:
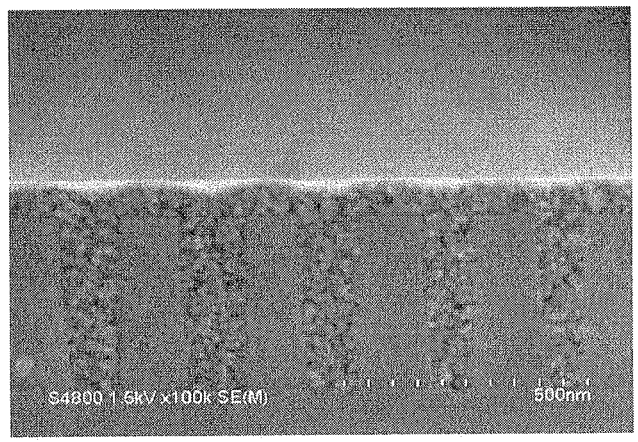
FIG. 12 is a cross-sectional SEM photograph showing a result of an embedding test using a resist underlayer film forming composition prepared in Example 12.
Figure 13:
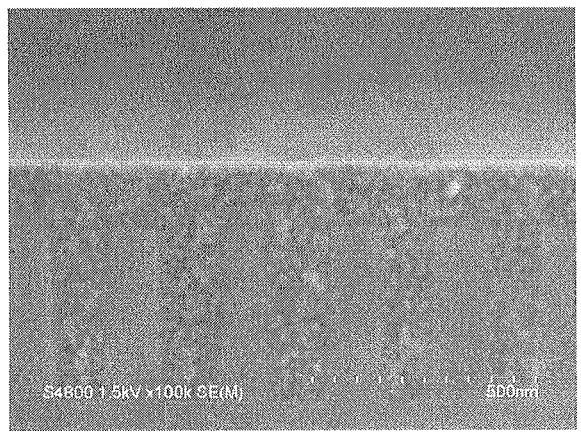
FIG. 13 is a cross-sectional SEM photograph showing a result of an embedding test using a resist underlayer film forming composition prepared in Example 13.
Figure 14:
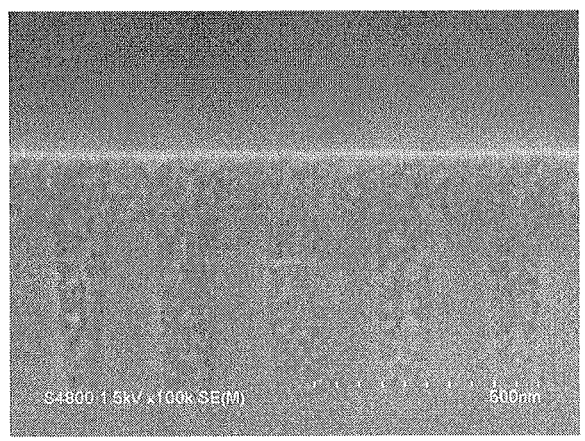
FIG. 14 is a cross-sectional SEM photograph showing a result of an embedding test using a resist underlayer film forming composition prepared in Example 14.
Figure 15:
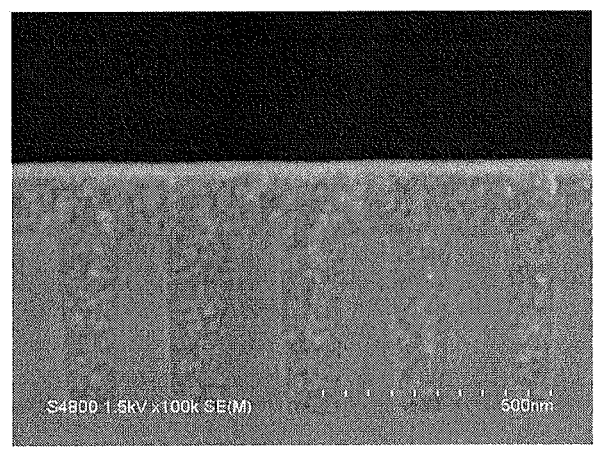
FIG. 15 is a cross-sectional SEM photograph showing a result of an embedding test using a resist underlayer film forming composition prepared in Example 15.
Figure 16:
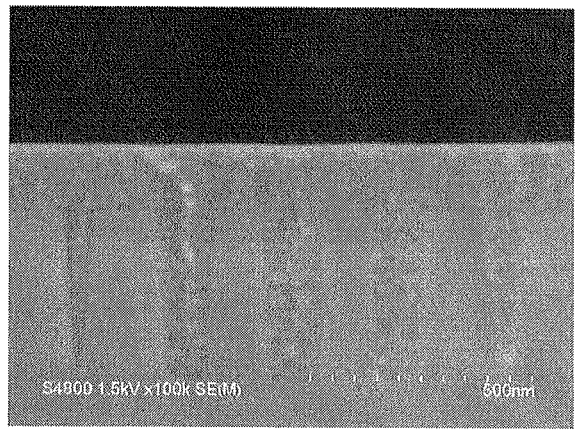
FIG. 16 is a cross-sectional SEM photograph showing a result of an embedding test using a resist underlayer film forming composition prepared in Example 16.
Figure 17:
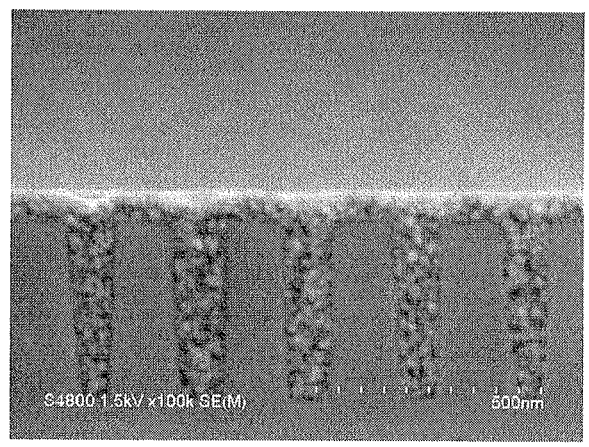
FIG. 17 is a cross-sectional SEM photograph showing a result of an embedding test using a resist underlayer film forming composition prepared in Example 17.
Figure 18:
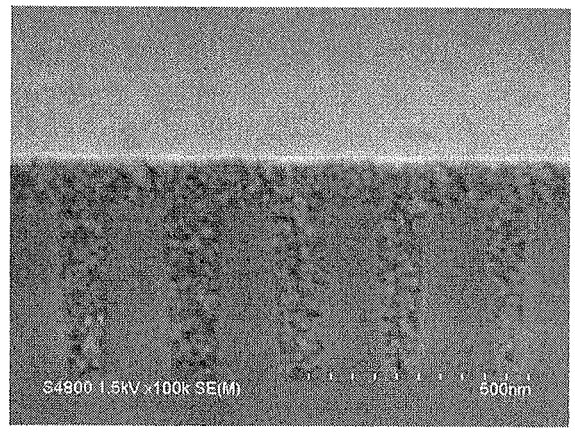
FIG. 18 is a cross-sectional SEM photograph showing a result of an embedding test using a resist underlayer film forming composition prepared in Example 18.
Figure 19:
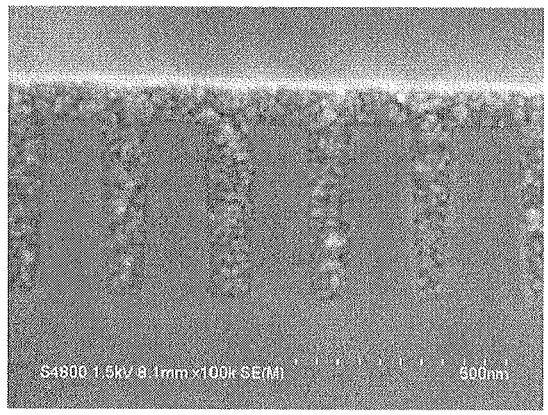
FIG. 19 is a cross-sectional SEM photograph showing a result of an embedding test using a resist underlayer film forming composition prepared in Example 19.
Figure 20:
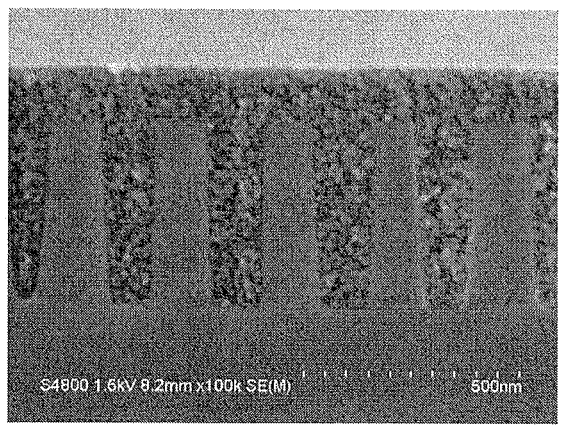
FIG. 20 is a cross-sectional SEM photograph showing a result of an embedding test using a resist underlayer film forming composition prepared in Example 20.

Examples of a structural unit of a polymer having a repeating structural unit of Formula (1a) contained in the resist underlayer film forming composition of the present invention include structural units of Formula (1-1) to Formula (1-36) below; examples of a structural unit of a polymer having a repeating structural unit of Formula (1b) include structural units of Formula (1-37) to Formula (1-72) below; and examples of a structural unit of a polymer having a repeating structural unit of Formula (1c) include structural units of Formula (1-73) to Formula (1-108) below. In Formula (1-37) to Formula (1-72), two Qs, $n_1$, and $n_2$ are the same as defined in Formula (1b).

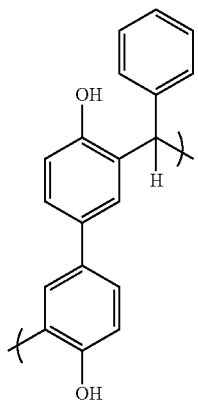

(1-1)

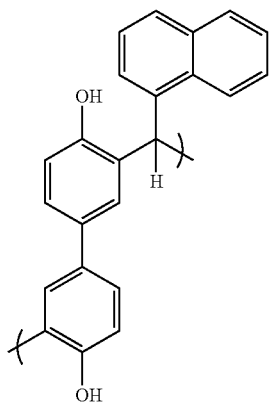

(1-2)

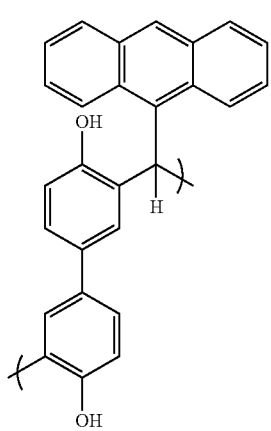

(1-3)

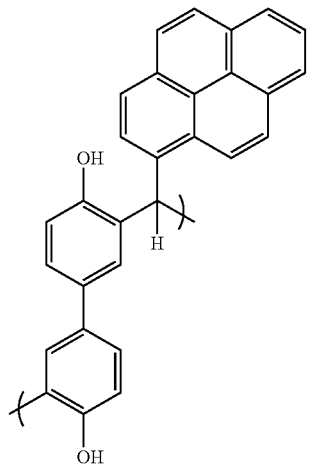

(1-4)

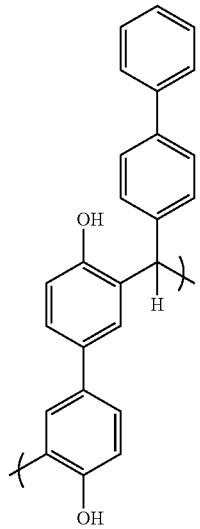

(1-5)

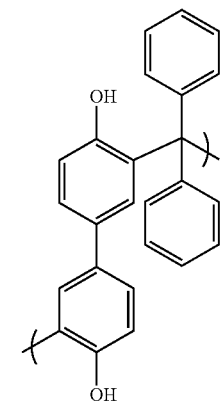

(1-6)

(1-7)
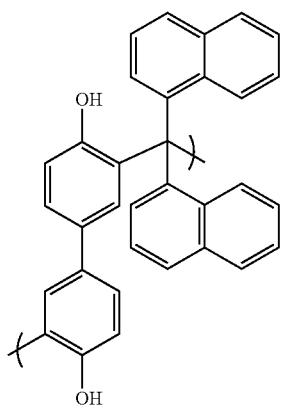
(1-8)
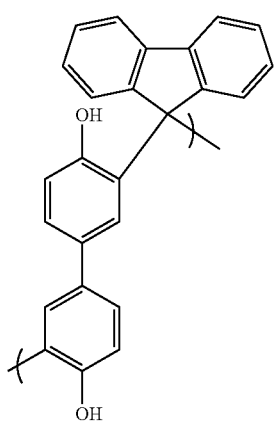
(1-9)
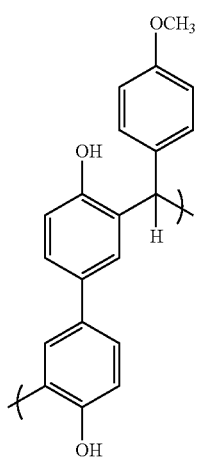
(1-10)
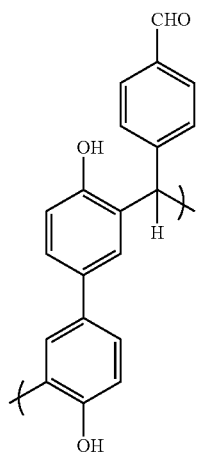
(1-11)
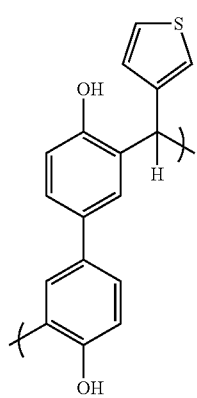
(1-12)
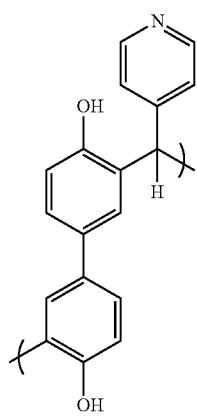
(1-13)

(1-14)
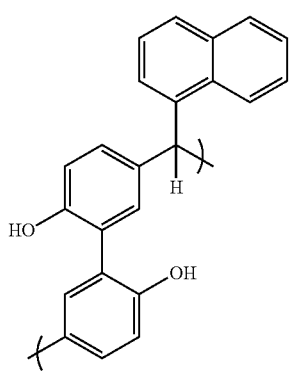
(1-15)
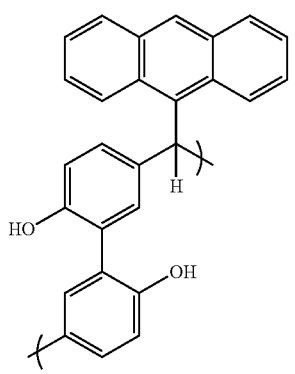
(1-16)
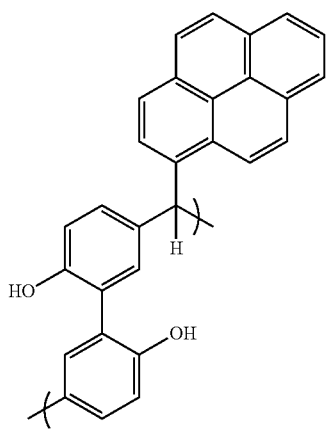
(1-17)
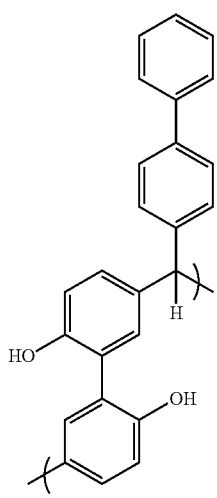
(1-18)
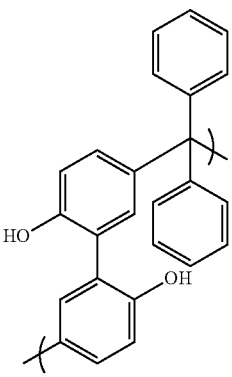
(1-19)
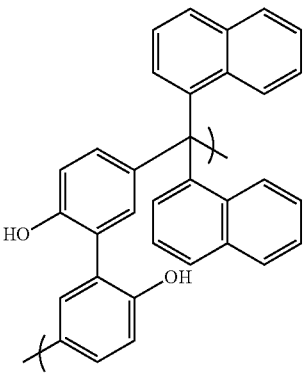
(1-20)
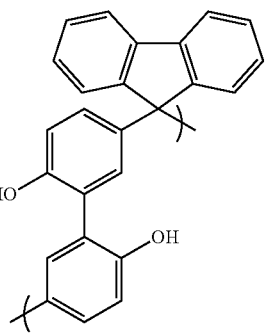
(1-21)
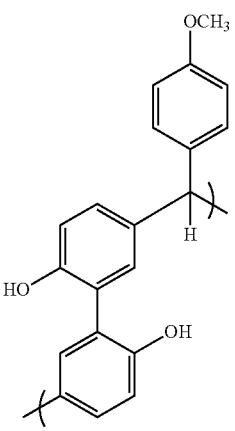

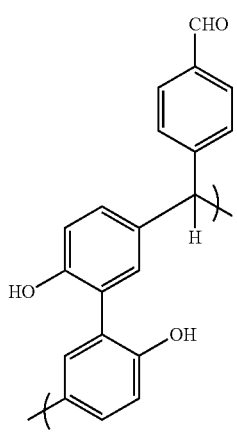
(1-22)
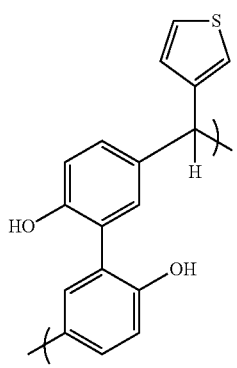
(1-23)
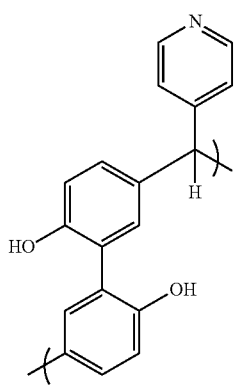
(1-24)
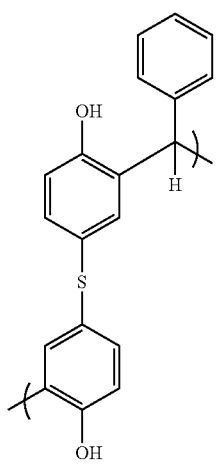
(1-25)
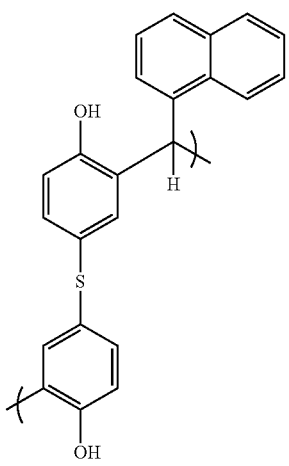
(1-26)
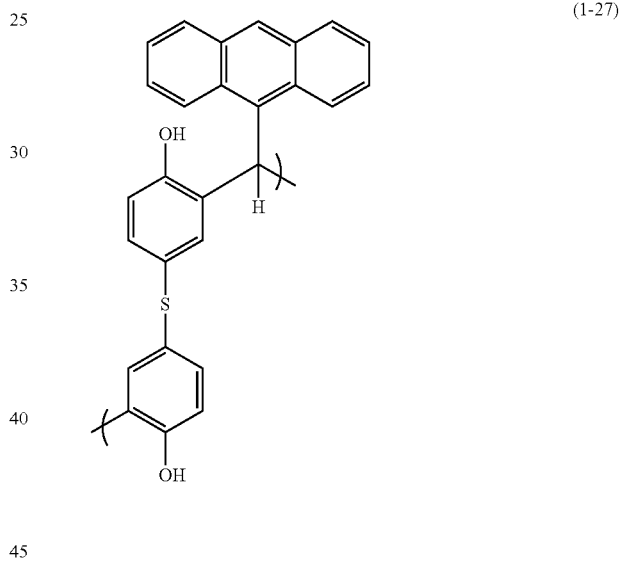
(1-27)
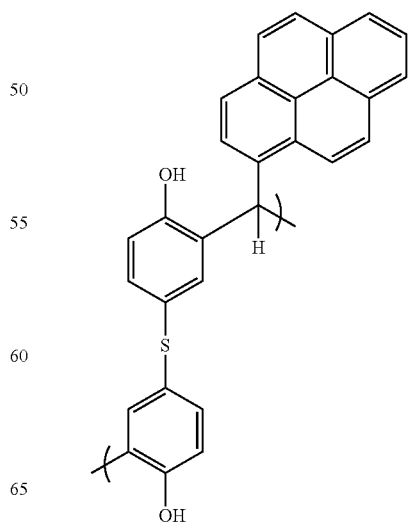
(1-28)

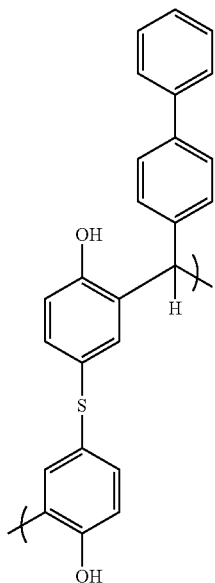 (1-29)
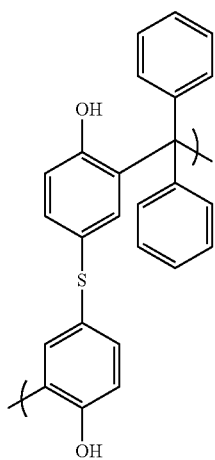 (1-30)
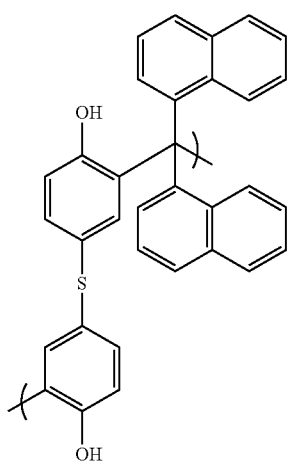 (1-31)
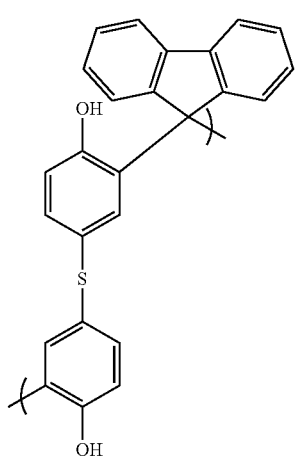 (1-32)
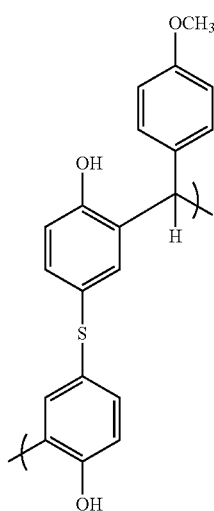 (1-33)
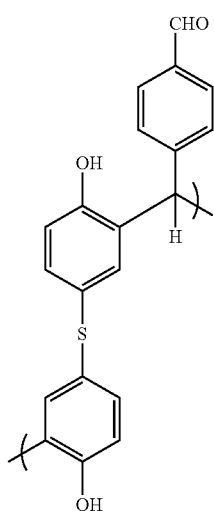 (1-34)

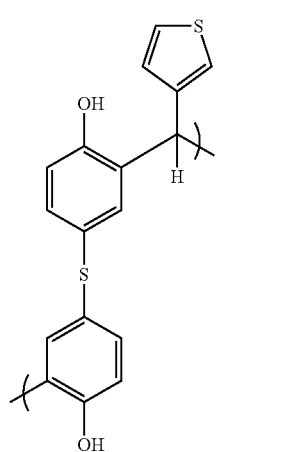
(1-35)
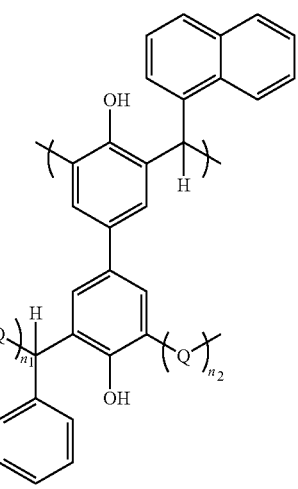
(1-38)
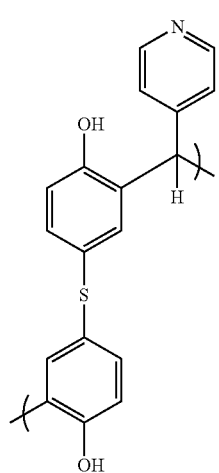
(1-36)
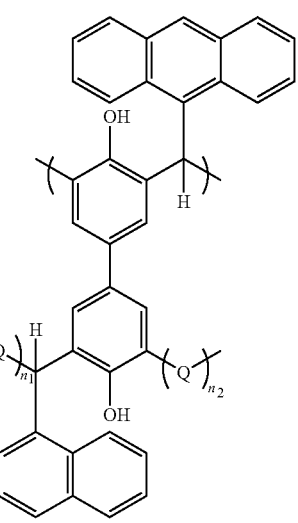
(1-39)
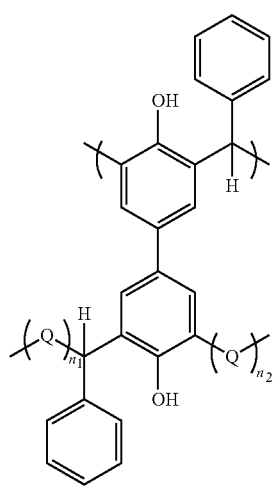
(1-37)
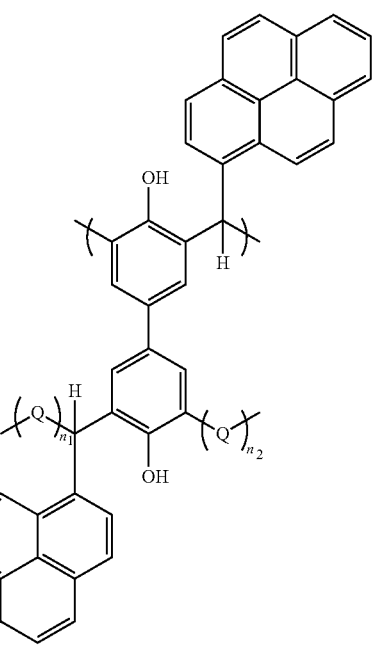
(1-40)

(1-41)
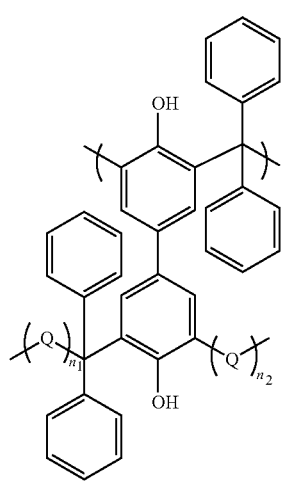
(1-42)
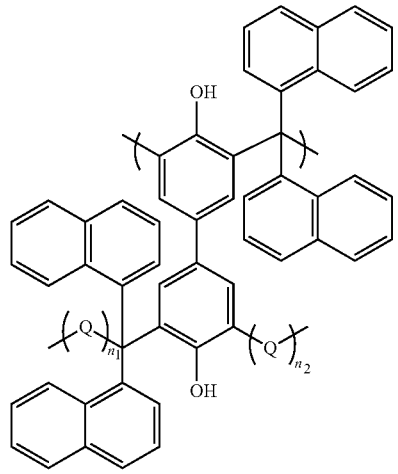
(1-43)
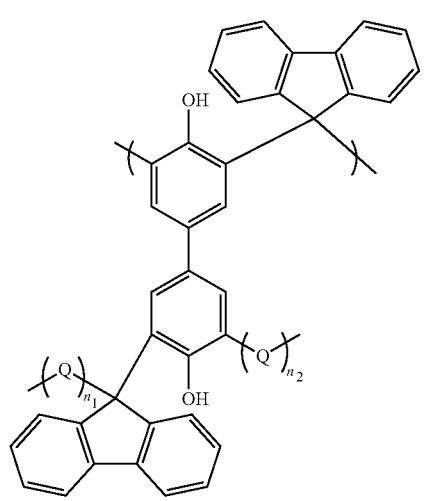
(1-44)
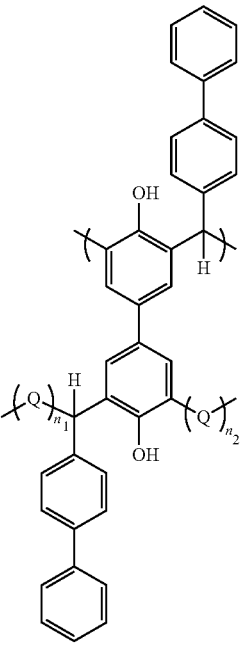
(1-45)
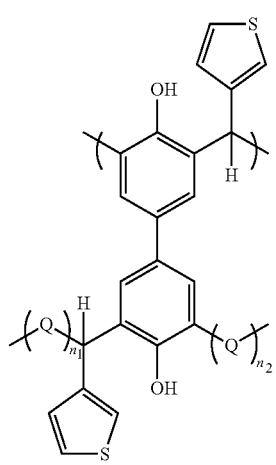
(1-46)
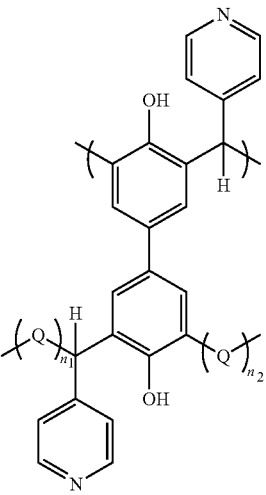

(1-47)
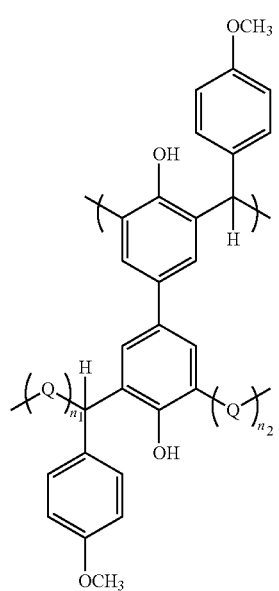
(1-48)
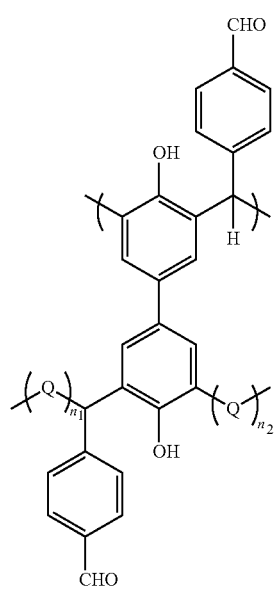
(1-49)
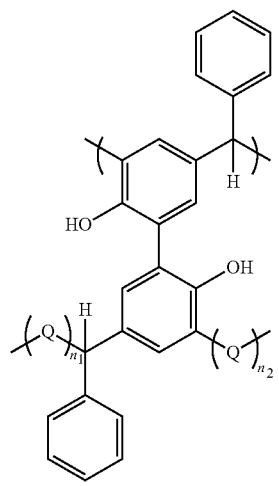
(1-50)
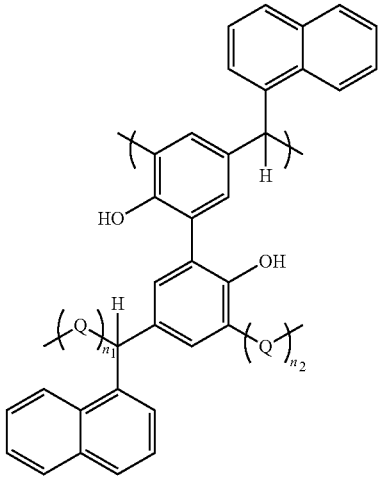
(1-51)
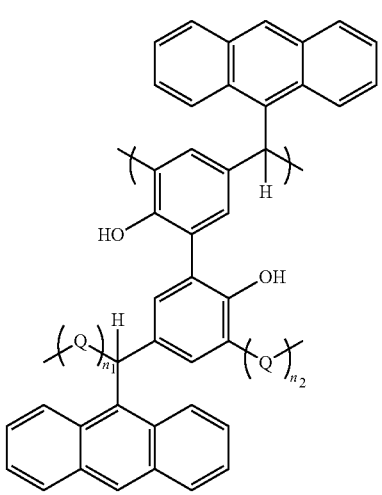
(1-52)
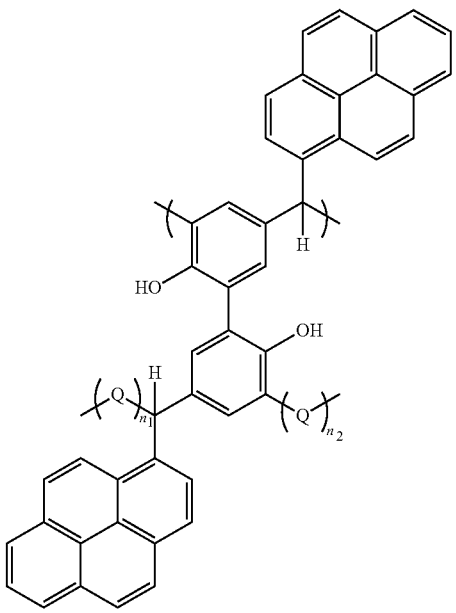

(1-53)
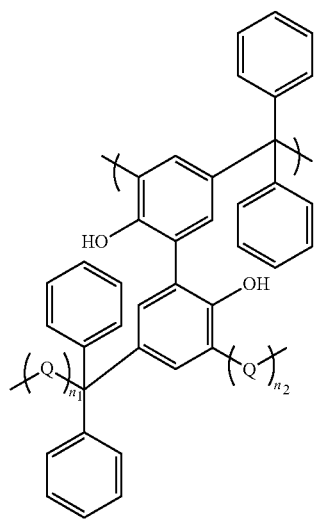
(1-54)
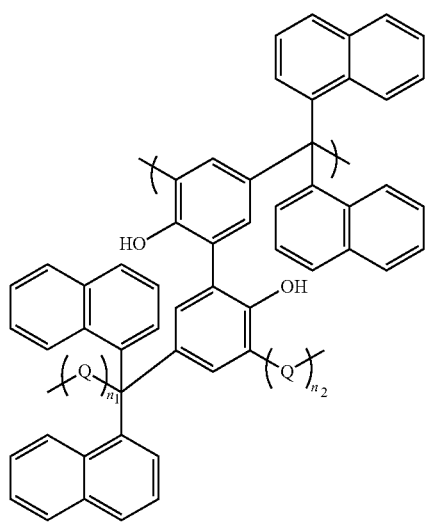
(1-55)
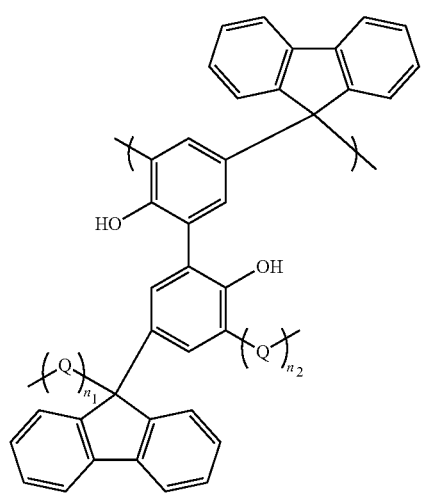
(1-56)
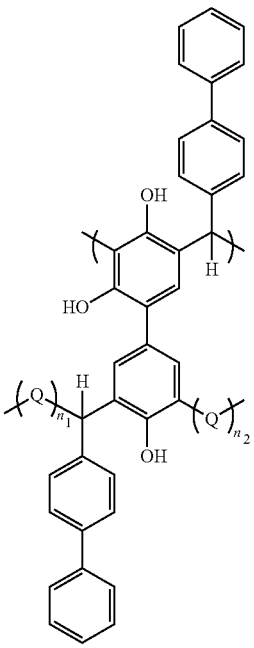
(1-57)
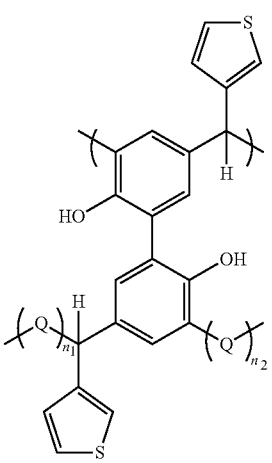
(1-58)
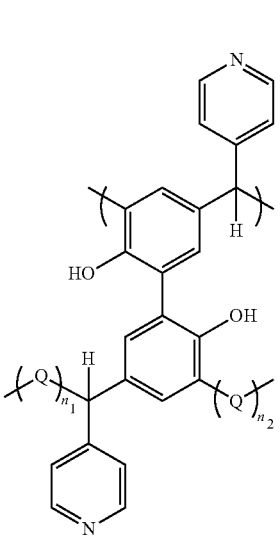

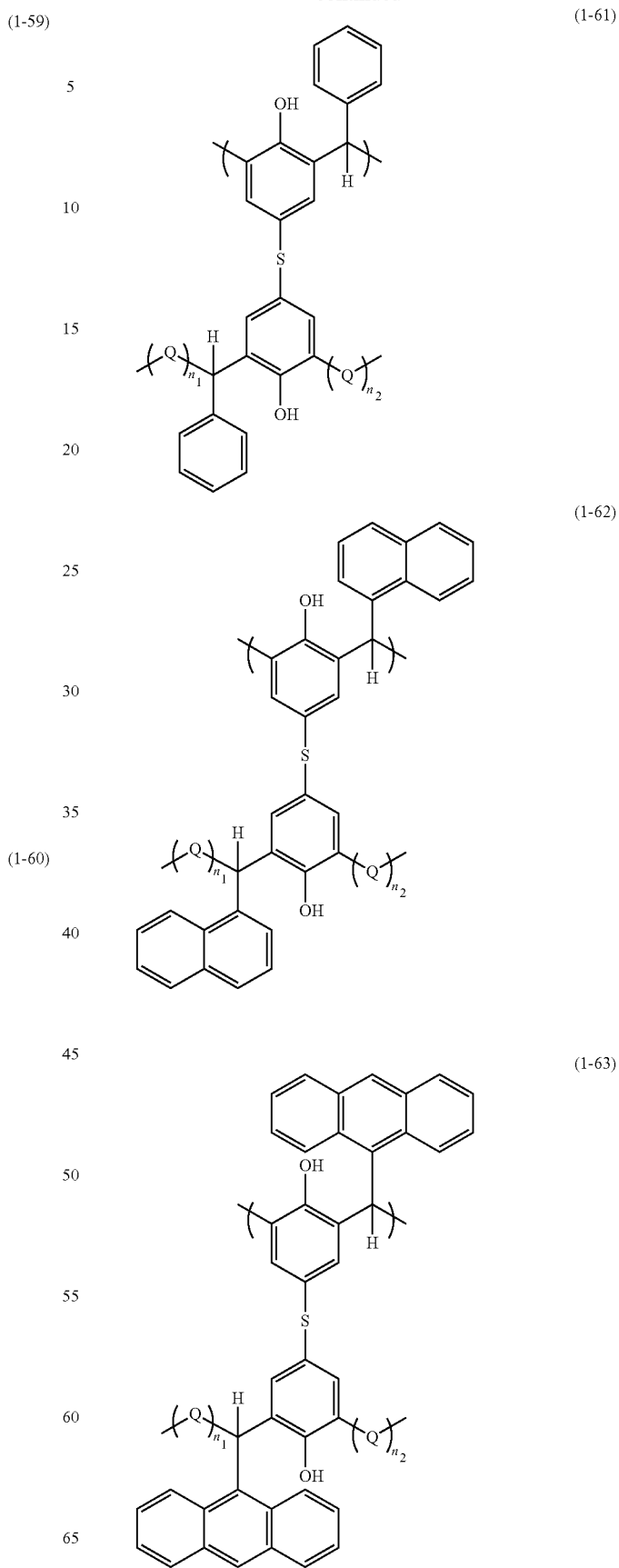

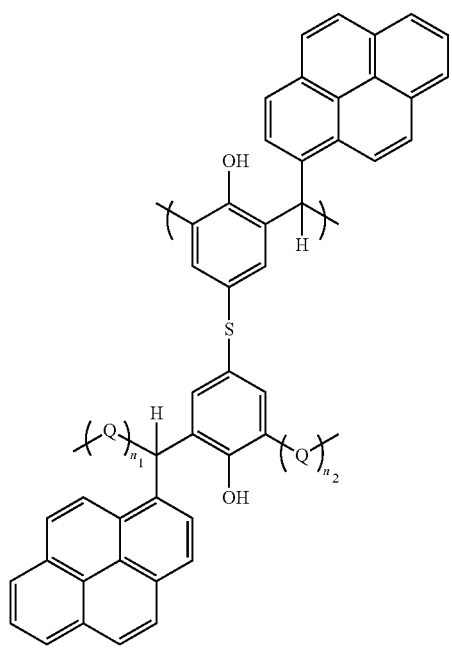
(1-64)
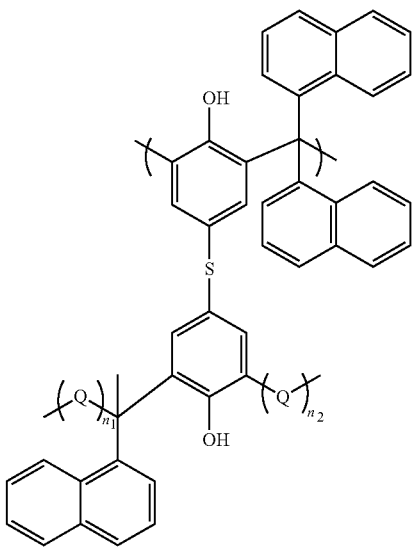
(1-66)
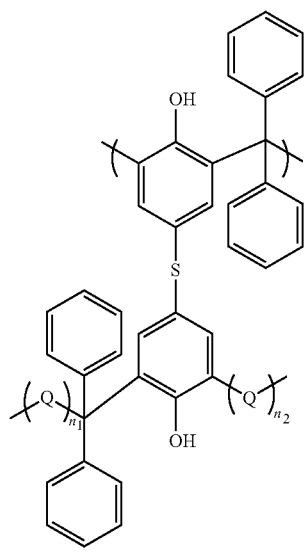
(1-65)
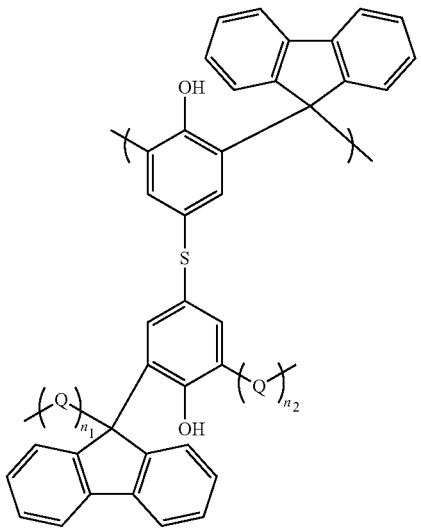
(1-67)

(1-68)
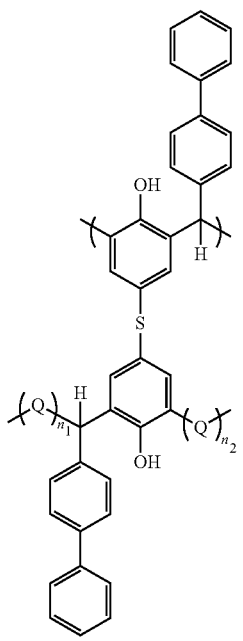
(1-69)
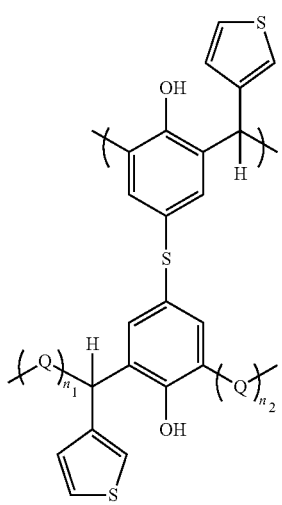
(1-70)
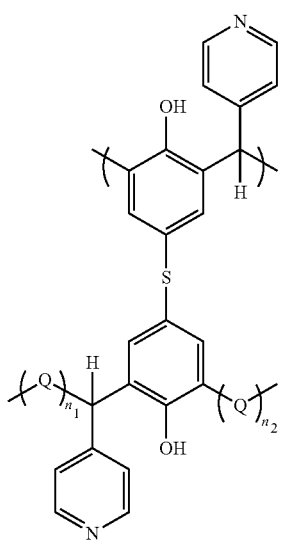
(1-71)
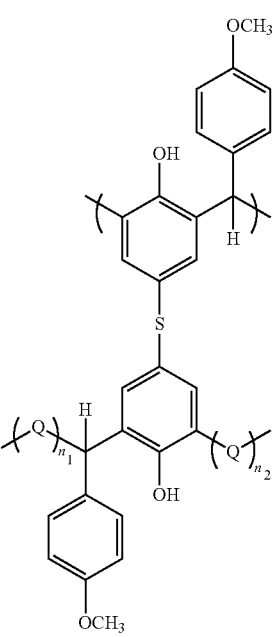
(1-72)
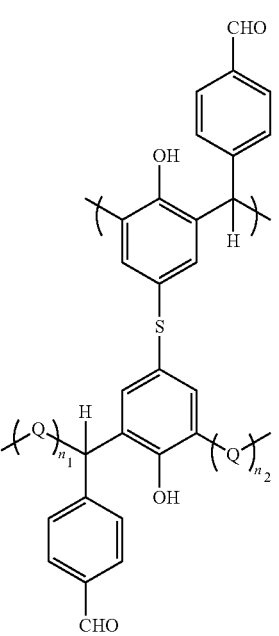
(1-73)
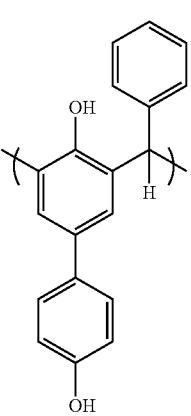

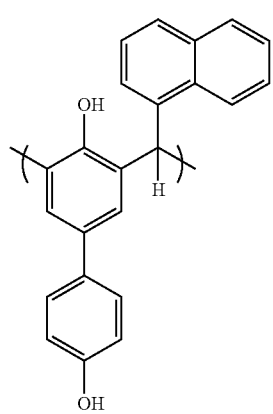
(1-74)
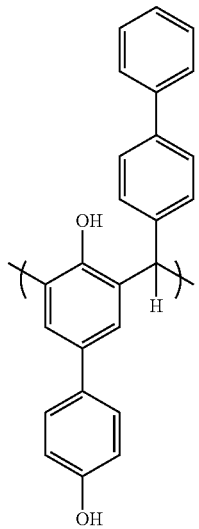
(1-77)
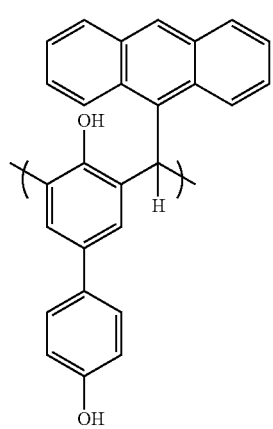
(1-75)
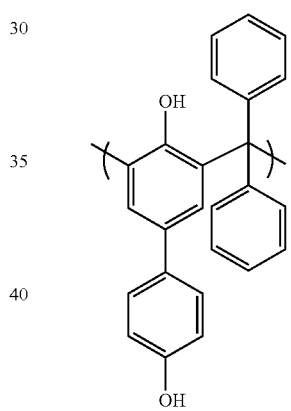
(1-78)
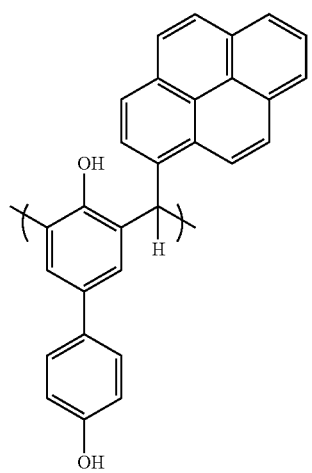
(1-76)
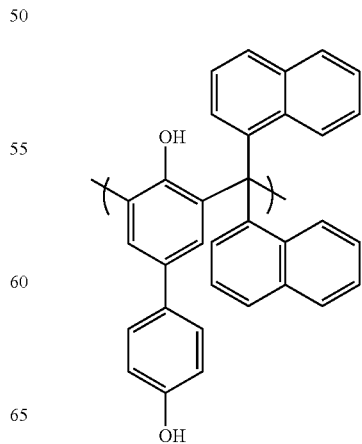
(1-79)

(1-80)
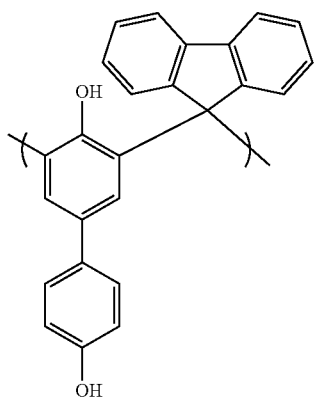
(1-81)
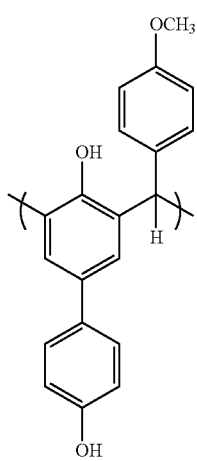
(1-82)
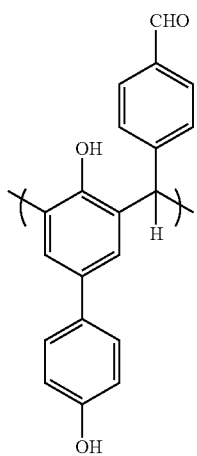
(1-83)
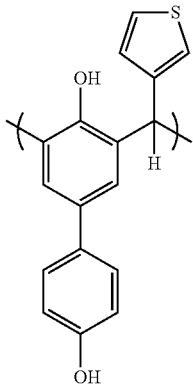
(1-84)
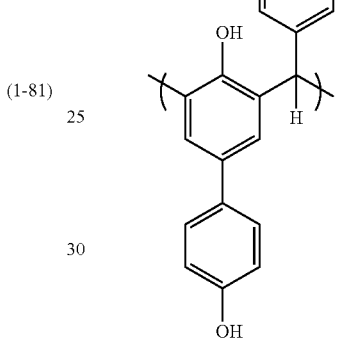
(1-85)
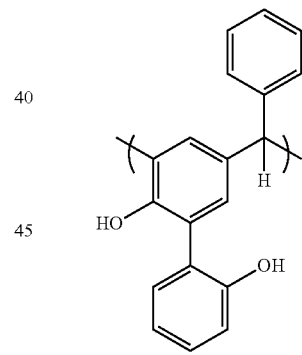
(1-86)
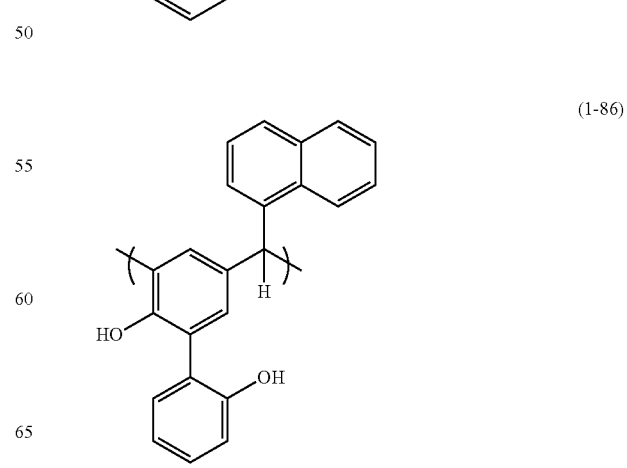

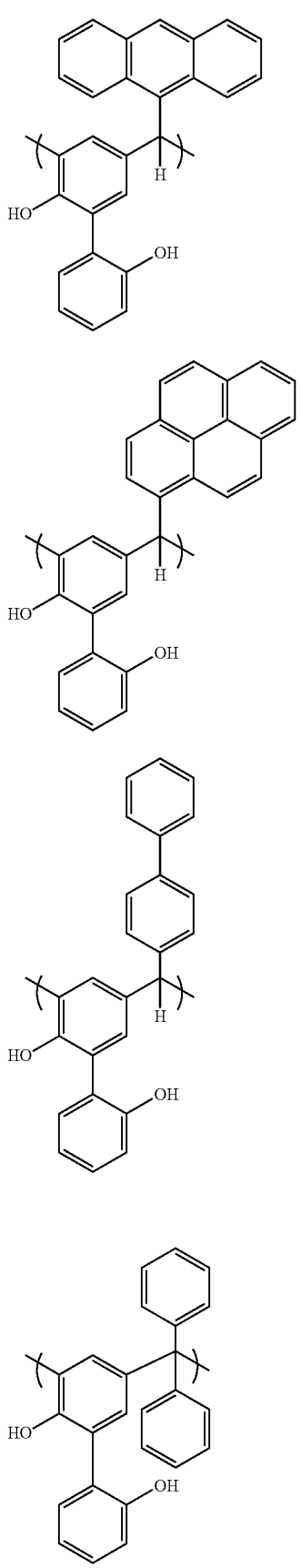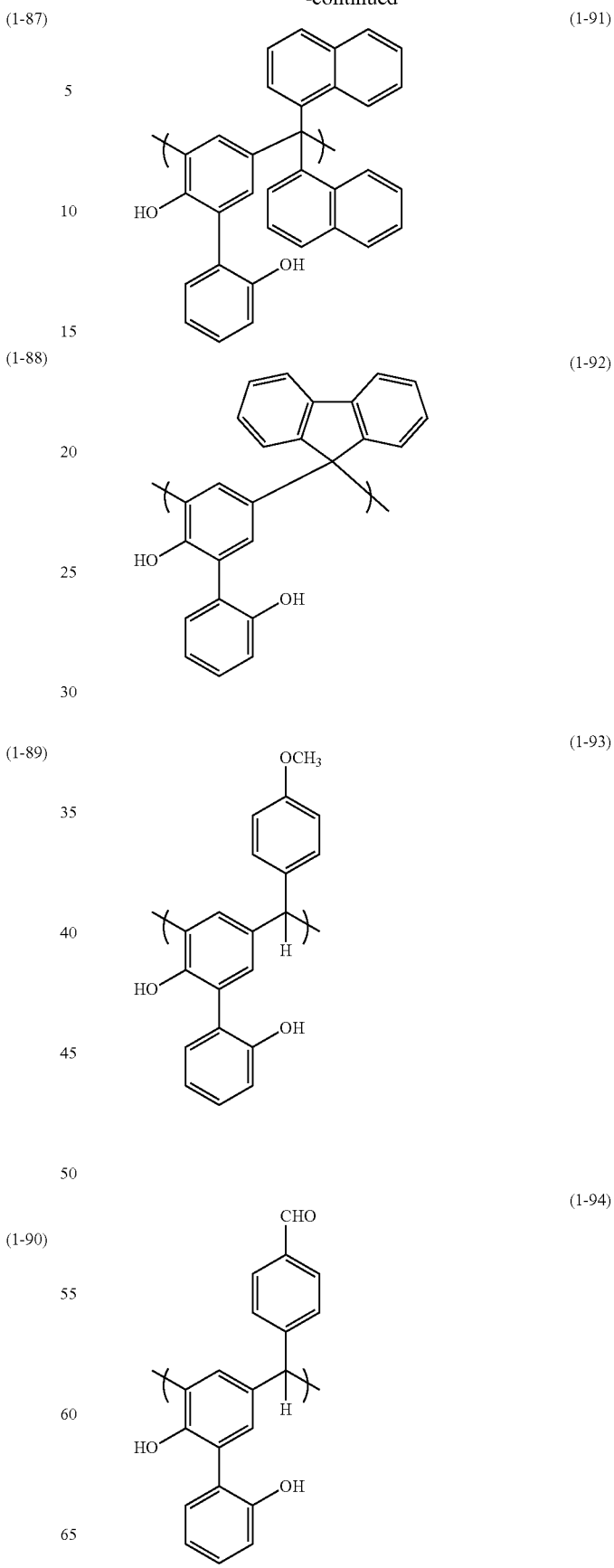

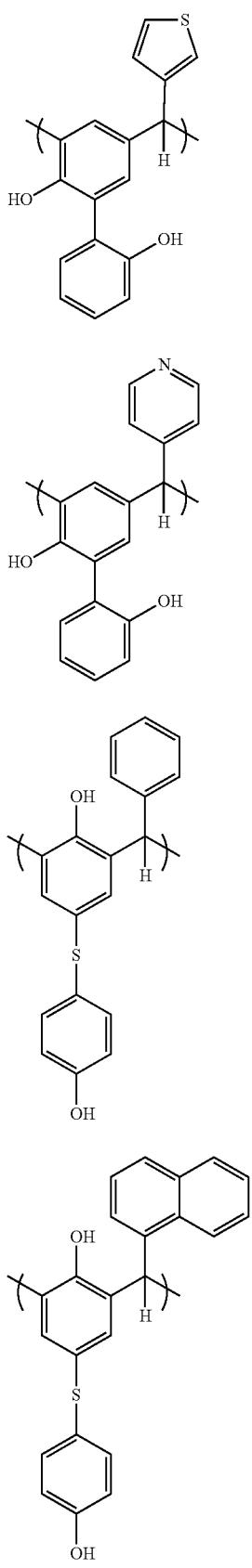
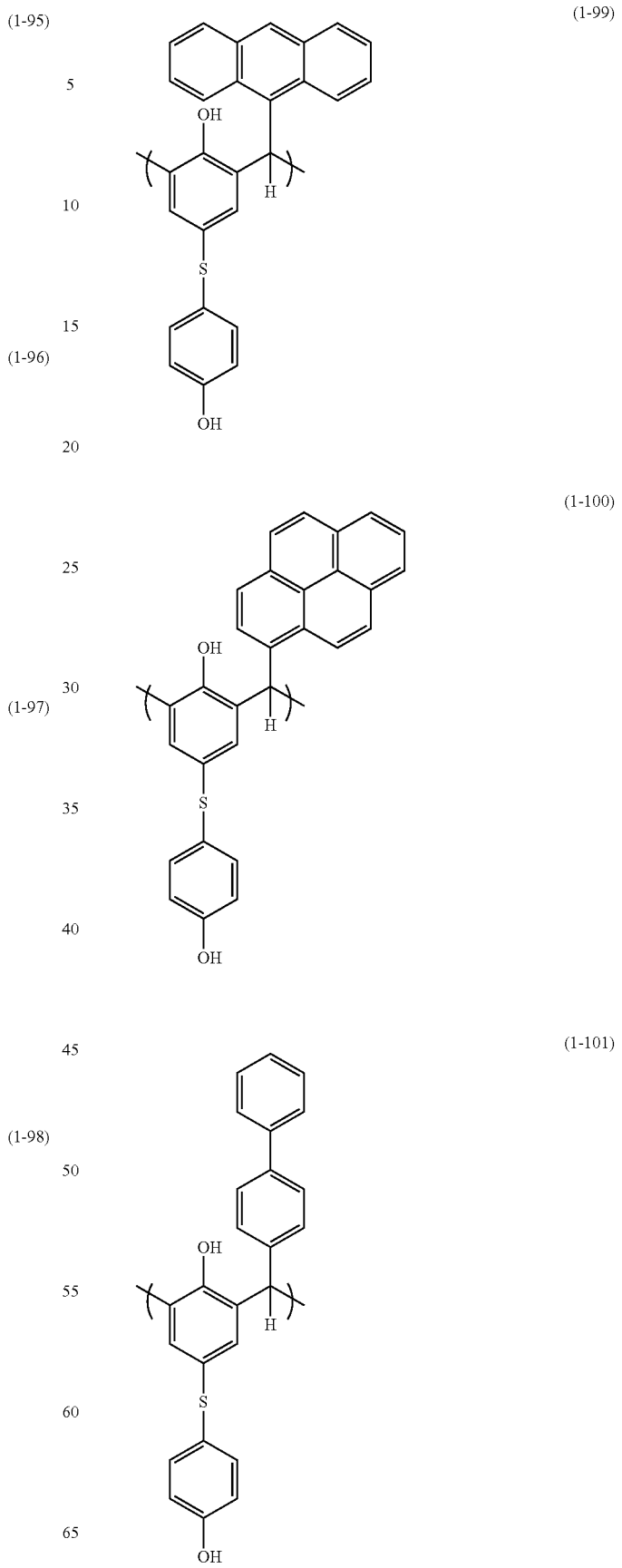

(1-102)
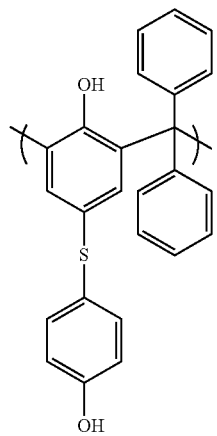
(1-103)
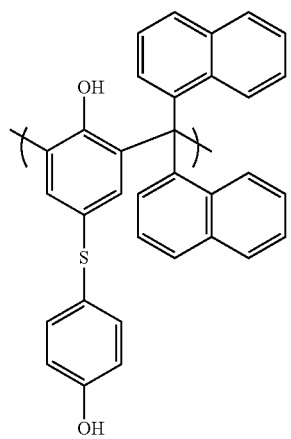
(1-104)
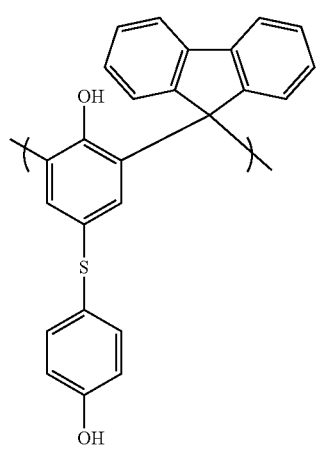
(1-105)
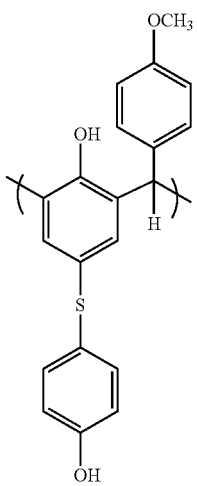
(1-106)
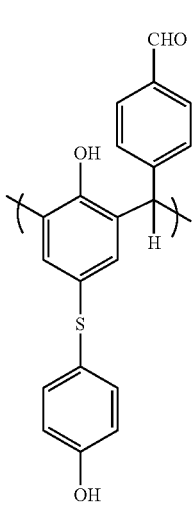
(1-107)
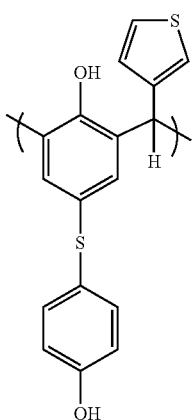

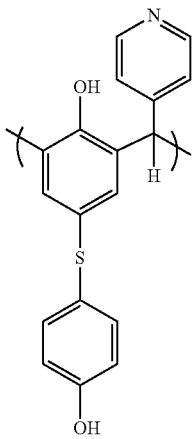

(1-108)

The polymer contained in the resist underlayer film forming composition of the present invention has a weight average molecular weight in terms of standard polystyrene of, for example, 1,000 to 5,000.

The polymer is synthesized by subjecting a biphenol compound or a bisphenol compound having two hydroxyphenyl groups and an aromatic aldehyde or an aromatic ketone to a polymerization reaction in the presence of an acid catalyst such as a sulfonic acid compound. Examples of the biphenol compound or the bisphenol compound having two hydroxyphenyl groups include 4,4'-biphenol, 2,2'-biphenol, 2,4'-biphenol, 4,4'-thiodiphenol, and 4,4'-oxydiphenol. Examples of the aromatic aldehyde used for the synthesis of the polymer include furfural, pyridinecarboxaldehyde, benzaldehyde, naphthylaldehyde, anthrylaldehyde, phenanthrylaldehyde, salisylaldehyde, phenylacetaldehyde, 3-phenylpropionaldehyde, tolylaldehyde, (N,N-dimethylamino)benzaldehyde, acetoxybenzaldehyde, 1-pyrenecarboxyaldehyde, and anisaldehyde, and there can be preferably used aromatic aldehydes excluding aldehydes having an aromatic heterocyclic ring such as furfural and pyridinecarboxaldehyde. Examples of the aromatic ketone used for the synthesis of the polymer include diaryl ketones such as diphenyl ketone, phenyl naphthyl ketone, dinaphthyl ketone, phenyl tolyl ketone, ditolyl ketone, and 9-fluorenone. The biphenol compound or the bisphenol compound used for the synthesis of the polymer is not limited to one type thereof and two or more types thereof may be used, and also the aromatic aldehyde or the aromatic ketone is not limited to one type thereof and two or more types thereof may be used. For example, 4,4-biphenol as the biphenol compound and benzaldehyde and naphthylaldehyde as the aromatic aldehyde can be used.

The resist underlayer film forming composition of the present invention may further contain a cross-linking agent. As the cross-linking agent, a cross-linkable compound having at least two cross-linkage forming substituents is preferably used. Examples of the cross-linking agent include melamine-based compounds, substituted urea-based compounds, and phenol-based compounds having a cross-linkage forming substituent such as a methylol group and a methoxymethyl group. Specific examples of the cross-linking agent include methoxymethylated glycoluril and methoxymethylated melamine such as tetramethoxymethyl glycoluril, tetrabutoxymethyl glycoluril, and hexamethoxymethylmelamine. Further, examples of the substituted urea-based compound include tetramethoxymethylurea and tetrabutoxymethylurea. Examples of the phenol-based compound include tetrahydroxymethylbiphenol, tetramethoxymethylbiphenol (TMOM-BP), and tetramethoxymethylbisphenol. As the cross-linking agent, a compound having at least two epoxy groups can also be used. Examples of such a compound include tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidyl phenyl glycidyl ether, 1,1,3-tris[p-(2,3-epoxypropoxyl)phenyl]propane, 1,2-cyclohexane dicarboxylic diglycidyl ester, 4,4'-methylenebis(N,N-diglycidylaniline), 3,4-epoxycyclohexylmethyl-3,4-epoxycyclohexane carboxylate, trimethylolethane triglycidyl ether, bisphenol-A-diglycidyl ether; Epolead [registered trademark] GT-401, GT-403, GT-301, and GT-302, Celloxide [registered trademark] 2021 and 3000 (manufactured by Daicel Chemical Industries, Ltd.); 1001, 1002, 1003, 1004, 1007, 1009, 1010, 828, 807, 152, 154, 180S75, 871, and 872 (manufactured by Mitsubishi Chemical Corporation); EPPN 201 and 202, EOCN-102, EOCN-103S, EOCN-104S, EOCN-1020, EOCN-1025, and EOCN-1027 (manufactured by Nippon Kayaku Co., Ltd.); Denacol [registered trademark] EX-252, EX-611, EX-612, EX-614, EX-622, EX-411, EX-512, EX-522, EX-421, EX-313, EX-314, and EX-321 (manufactured by Nagase ChemteX Corporation); CY175, CY177, CY179, CY182, CY184, and CY192 (manufactured by BASF Japan Ltd.); and Epiclon 200, 400, 7015, 835LV, and 850CRP (manufactured by DIC Corporation). As the compound having at least two epoxy groups, an epoxy resin having an amino group can also be used. Examples of such an epoxy resin include YH-434 and YH-434L (manufactured by NSCC Epoxy Manufacturing Co., Ltd.) (formerly: Tohto Kasei Co., Ltd.).

As the cross-linking agent, a compound having at least two block isocyanate groups can also be used. Examples of such a compound include TAKENATE [registered trademark] B-830 and B-870N (manufactured by Mitsui Chemicals, Inc.) and VESTANAT [registered trademark] B 1358/100 (manufactured by Evonik Industries AG).

As the cross-linking agent, a compound having at least two vinyl ether groups can also be used. Examples of such a compound include bis(4-(vinyloxymethyl)cyclohexylmethyl) glutarate, tri(ethylene glycol) divinyl ether, adipic acid divinyl ester, diethylene glycol divinyl ether, 1,2,4-tris(4-vinyloxybutyl) trimellitate, 1,3,5-tris(4-vinyloxybutyl) trimellitate, bis(4-(vinyloxy)butyl) terephthalate, bis(4-(vinyloxy)butyl isophthalate, ethylene glycol divinyl ether, 1,4-butanediol divinyl ether, tetramethylene glycol divinyl ether, tetraethylene glycol divinyl ether, neopentyl glycol divinyl ether, trimethylol propane trivinyl ether, trimethylol ethane trivinyl ether, hexane diol divinyl ether, 1,4-cyclohexanediol divinyl ether, tetraethylene glycol divinyl ether, pentaerythritol divinyl ether, pentaerythritol trivinyl ether, and cyclohexane dimethanol divinyl ether.

One type selected from these various cross-linking agents may be blended in the composition or two or more types selected from these various cross-linking agents may be blended in combination in the composition. The content ratio of the cross-linking agent is, for example, 2% by mass to 60% by mass, based on the mass of the solid content remaining after removing the solvent described below from the resist underlayer film forming composition of the present invention.

The resist underlayer film forming composition of the present invention may further contain an acidic compound. The acidic compound acts as a catalyst that accelerates the cross-linking reaction, and examples thereof include: sulfonic acid compounds and carboxylic acid compounds such as p-toluene sulfonic acid, trifluoromethanesulfonic acid, pyridinium-p-toluenesulfonate, salicylic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid, and hydroxybenzoic acid; and inorganic acids such as hydrochloric acid, sulfuric acid, nitric acid, and phosphoric acid. The resist underlayer film forming composition of the present invention may contain a thermoacid generator instead of or together with the above acidic compound. The thermoacid generator also acts as a catalyst that accelerates the cross-linking reaction, and examples thereof include a quaternary ammonium salt of trifluoromethanesulfonic acid. One type selected from these acidic compounds and these thermoacid generators may be blended in the composition or two or more types selected from these acidic compounds and these thermoacid generators may be blended in combination in the composition. The content ratio of the acidic compound or the thermoacid generator is, for example, 0.1% by mass to 20% by mass, based on the mass of the solid content remaining after removing the solvent described below from the resist underlayer film forming composition of the present invention.

The resist underlayer film forming composition of the present invention may further contain a surfactant. Examples of the surfactant include: nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan tri-oleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan tri-oleate, and polyoxyethylene sorbitan tristearate; fluorinated surfactants, for example, EFTOP [registered trademark] EF301, EF303, and EF352 (manufactured by Mitsubishi Materials Electronic Chemicals Co., Ltd.), MEGAFAC [registered trademark] F171, F173, R-30, and R-30-N (manufactured by DIC Corporation), Fluorad FC430 and FC431 (manufactured by Sumitomo 3M Limited), AsahiGuard [registered trademark] AG710 and Surflon [registered trademark] S-382, SC101, SC102, SC103, SC104, SC105, and SC106 (manufactured by Asahi Glass Co., Ltd.); and Organosiloxane polymer KP341 (manufactured by Shin-Etsu Chemical Co., Ltd.). One type selected from these surfactants may be blended in the composition or two or more types selected from these surfactants may be blended in combination in the composition. The content ratio of the surfactant is, for example, 0.01% by mass to 5% by mass, based on the mass of the solid content remaining after removing the solvent described below from the resist underlayer film forming composition of the present invention.

The resist underlayer film forming composition of the present invention can be prepared by dissolving the above-described components in an appropriate solvent and is used in a homogeneous solution state. Examples of such a solvent include ethylene glycol monomethyl ether, ethylene glycol monoethyl ether, diethylene glycol monomethyl ether, diethylene glycol monoethyl ether, propylene glycol, propylene glycol monomethyl ether, propylene glycol monopropyl ether, propylene glycol monomethyl ether acetate, propylene glycol propyl ether acetate, methyl cellosolve acetate, ethyl cellosolve acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, and N-methylpyrrolidone. These organic solvents may be used individually or in combination of two or more types thereof. The content ratio of the solid content remaining after removing the organic solvent from the composition is, for example, 0.5% by mass to 30% by mass and preferably 0.8% by mass to 15% by mass.

The process of applying the resist underlayer film forming composition of the present invention onto a surface having a level difference and a concave part and/or a convex part and baking the composition is performed by: applying the composition onto a substrate (for example, a silicon wafer on which wirings or other structures are formed and that may be coated with a silicon oxide film, a silicon nitride film, a silicon oxide nitride film, or a film of a metal such as aluminum and tungsten) having a level difference and a concave part and/or a convex part by an appropriate applying method such as a spinner and a coater; and baking the composition using a heating means such as a hot plate. The baking conditions are appropriately selected from the baking temperature of 100° C. to 400° C. and the baking time of 0.3 minute to 10 minutes.

On the first resist underlayer film formed by the above process, an organopolysiloxane film is formed as a second resist underlayer film and thereon, a resist pattern is formed. In the process of forming a resist pattern, the exposure is performed by drawing either through a mask (reticle) for forming a predetermined pattern or directly. As the exposure light source, for example, a g-line, an i-line, KrF excimer laser, ArF excimer laser, EUV, or an electron beam can be used. After the exposure, if necessary, baking after the exposure (Post Exposure Bake) is performed. Then, the resist pattern is developed with a developer (for example, 2.38% by mass tetramethylammonium hydroxide aqueous solution) and is further rinsed with a rinsing liquid or pure water to remove the used developer. Then, the post bake is performed for drying the resist pattern and for enhancing the adhesion of the resist pattern with the undercoat.

The etching process performed after the resist pattern is formed, is performed by dry-etching. Examples of the etching gas used for dry-etching include: for the second resist underlayer film (organopolysiloxane film), $CHF_3$, $CF_4$, and $C_2F_6$; for the first resist underlayer film formed from the resist underlayer film forming composition of the present invention, $O_2$, $N_2O$, and $NO_2$; and for a surface having a level difference or a concave part and/or a convex part, $CHF_3$, $CF_4$, and $C_2F_6$. Further, with these gases, argon, nitrogen, or carbon dioxide may be mixed to be used.

Hereinafter, the present invention will be described referring to Synthesis Examples and Examples. However, the present invention is not limited to such examples described below.

EXAMPLES

The weight average molecular weight and the polydispersity shown in Synthesis Example 1 to Synthesis Example 3 and Comparative Synthesis Example 1 and Comparative Synthesis Example 2, which are described below, are based on the measurement results of gel permeation chromatography (hereinafter, abbreviated as GPC in the present specification).

For the measurement, a GPC apparatus manufactured by Tosoh Corporation was used and the measurement conditions were as follows:
GPC column: TSKgel SuperMultipore [registered trademark] Hz-N (manufactured by Tosoh Corporation)
Column temperature: 40° C.
Solvent: tetrahydrofuran (THF)
Flow rate: 0.35 mL/minute
Standard sample: polystyrene (manufactured by Tosoh Corporation).

Synthesis Example 1

In nitrogen, into a 300 mL four-neck flask, 4,4'-biphenol (15.00 g, 0.0806 mol, manufactured by Tokyo Chemical Industry Co., Ltd.), 1-pyrenecarboxaldehyde (18.548 g, 0.0806 mol, manufactured by Sigma Aldrich Corp.), and p-toluenesulfonic acid monohydrate (33.2096 g, 0.0161 mol, manufactured by Tokyo Chemical Industry Co., Ltd.) were added and thereto, propylene glycol monomethyl ether (44.93 g, manufactured by Kanto Chemical Co., Inc.) was further charged. The resultant mixture was stirred and the temperature of the mixture was elevated to 120° C. to dissolve the mixture, followed by initiating the polymerization. After 24 hours, the mixture was left to cool down to room temperature and was subjected to reprecipitation in methanol (1,800 g, manufactured by Kanto Chemical Co., Inc.). The resultant precipitate was filtered and was dried with a vacuum dryer at 50° C. for 10 hours to obtain 19.08 g of the objective polymer (hereinafter, abbreviated as 4,4'-BPOH-Py in the present specification). The weight average molecular weight Mw of 4,4'-BPOH-Py measured by GPC in terms of polystyrene was 2,200 and a polydispersity Mw/Mn was 2.10. The polymer obtained in the present Synthesis Example has a structural unit of Formula (1-4) and a structural unit of Formula (1-76).

Synthesis Example 2

In nitrogen, into a 1,000 mL four-neck flask, 2,2'-biphenol (70.00 g, 0.3759 mol, manufactured by Tokyo Chemical Industry Co., Ltd.), 1-pyrenecarboxaldehyde (86.559 g, 0.3759 mol, manufactured by Sigma Aldrich Corp.), and methanesulfonic acid (10.8389 g, 0.1126 mol, manufactured by Tokyo Chemical Industry Co., Ltd.) were added and thereto, propylene glycol monomethyl ether (167.40 g, manufactured by Kanto Chemical Co., Inc.) was further charged. The resultant mixture was stirred and the temperature of the mixture was elevated to 120° C. to dissolve the mixture, followed by initiating the polymerization. After 24 hours, the mixture was left to cool down to room temperature and was subjected to reprecipitation in methanol (3,000 g, manufactured by Kanto Chemical Co., Inc.). The resultant precipitate was filtered and was dried with a vacuum dryer at 50° C. for 10 hours to obtain 84.1 g of the objective polymer (hereinafter, abbreviated as 2,2'-BPOH-Py in the present specification). The weight average molecular weight Mw of 2,2'-BPOH-Py measured by GPC in terms of polystyrene was 1,400 and a polydispersity Mw/Mn was 1.49. The polymer obtained in the present Synthesis Example has a structural unit of Formula (1-16) and a structural unit of Formula (1-88).

Synthesis Example 3

In nitrogen, into a 200 mL four-neck flask, 4,4'-thiodiphenol (12.50 g, 0.0573 mol, manufactured by Tokyo Chemical Industry Co., Ltd.), 1-pyrenecarboxaldehyde (13.19 g, 0.0573 mol, manufactured by Tokyo Chemical Industry Co., Ltd.), and methanesulfonic acid (1.1008 g, 0.0115 mol, manufactured by Kanto Chemical Co., Inc.) were added and thereto, propylene glycol monomethyl ether (32.74 g, manufactured by Kanto Chemical Co., Inc.) was further charged. The resultant mixture was stirred and the temperature of the mixture was elevated to 120° C. to dissolve the mixture, followed by initiating the polymerization. After 24 hours, the mixture was left to cool down to room temperature and was subjected to reprecipitation in methanol (1,000 g, manufactured by Kanto Chemical Co., Inc.). The resultant precipitate was filtered and was dried with a vacuum dryer at 50° C. for 10 hours and further at 120° C. for 24 hours to obtain 11.6 g of the objective polymer (hereinafter, abbreviated as TDP-Py in the present specification). The weight average molecular weight Mw of TDP-Py measured by GPC in terms of polystyrene was 1,010 and a polydispersity Mw/Mn was 1.67. The polymer obtained in the present Synthesis Example has a structural unit of Formula (1-28) and a structural unit of Formula (1-100).

Synthesis Example 4

In nitrogen, into a 300 mL four-neck flask, 4,4'-biphenol (10.00 g, 0.0537 mol, manufactured by Tokyo Chemical Industry Co., Ltd.), 1-pyrenecarboxaldehyde (24.731 g, 0.1074 mol, manufactured by Sigma Aldrich Corp.), and p-toluenesulfonic acid monohydrate (4.2795 g, 0.0215 mol, manufactured by Tokyo Chemical Industry Co., Ltd.) were added and thereto, propylene glycol monomethyl ether (47.68 g, manufactured by Kanto Chemical Co., Inc.) was further charged. The resultant mixture was stirred and the temperature of the mixture was elevated to 120° C. to dissolve the mixture, followed by initiating the polymerization. After 24 hours, the mixture was left to cool down to room temperature and was subjected to reprecipitation in methanol (1,800 g, manufactured by Kanto Chemical Co., Inc.). The resultant precipitate was filtered and was dried with a vacuum dryer at 50° C. for 10 hours to obtain 21.58 g of the objective polymer (hereinafter, abbreviated as 4,4'-BPOH-Py2 in the present specification). The weight average molecular weight Mw of 4,4'-BPOH-Py2 measured by GPC in terms of polystyrene was 2,180 and a polydispersity Mw/Mn was 2.11. The polymer obtained in the present Synthesis Example has a structural unit of Formula (1-40).

Synthesis Example 5

In nitrogen, into a 1,000 mL four-neck flask, 2,2'-biphenol (25.00 g, 0.1343 mol, manufactured by Tokyo Chemical Industry Co., Ltd.), 1-pyrenecarboxaldehyde (61.828 g, 0.2685 mol, manufactured by Sigma Aldrich Corp.), and methanesulfonic acid (7.7421 g, 0.0806 mol, manufactured by Tokyo Chemical Industry Co., Ltd.) were added and thereto, propylene glycol monomethyl ether (94.57 g, manufactured by Kanto Chemical Co., Inc.) was further charged. The resultant mixture was stirred and the temperature of the mixture was elevated to 120° C. to dissolve the mixture, followed by initiating the polymerization. After 24 hours, the mixture was left to cool down to room temperature and was subjected to reprecipitation in methanol (3,000 g, manufactured by Kanto Chemical Co., Inc.). The resultant precipitate was filtered and was dried with a vacuum dryer at 50° C. for 10 hours to obtain 68.22 g of the objective polymer (hereinafter, abbreviated as 2,2'-BPOH-Py2 in the present specification). The weight average molecular weight Mw of 2,2'-BPOH-Py2 measured by GPC in terms of polystyrene was 1,270 and a polydispersity Mw/Mn was 1.77. The polymer obtained in the present Synthesis Example has a structural unit of Formula (1-52).

Synthesis Example 6

In nitrogen, into a 200 mL four-neck flask, 4,4'-thiodiphenol (8.00 g, 0.0367 mol, manufactured by Tokyo Chemical Industry Co., Ltd.), 1-pyrenecarboxaldehyde (16.88 g, 0.0773 mol, manufactured by Tokyo Chemical Industry Co., Ltd.), and methanesulfonic acid (1.4090 g, 0.0147 mol, manufactured by Kanto Chemical Co., Inc.) were added and thereto, propylene glycol monomethyl ether (32.13 g, manufactured by Kanto Chemical Co., Inc.) was further charged. The resultant mixture was stirred and the temperature of the mixture was elevated to 120° C. to dissolve the mixture, followed by initiating the polymerization. After 24 hours, the mixture was left to cool down to room temperature and was subjected to reprecipitation in methanol (1,000 g, manufactured by Kanto Chemical Co., Inc.). The resultant precipitate was filtered and was dried with a vacuum dryer at 50° C. for 10 hours and further at 120° C. for 24 hours to obtain 13.2 g of the objective polymer (hereinafter, abbreviated as TDP-Py2 in the present specification). The weight average molecular weight Mw of TDP-Py2 measured by GPC in terms of polystyrene was 1,100 and a polydispersity Mw/Mn was 1.64. The polymer obtained in the present Synthesis Example has a structural unit of Formula (1-64).

Synthesis Example 7

In nitrogen, into a 500 mL four-neck flask, 4,4'-biphenol (30.00 g, 0.1611 mol, manufactured by Tokyo Chemical Industry Co., Ltd.), 1-naphthaldehyde (50.324 g, 0.3222 mol, manufactured by Sigma Aldrich Corp.), and p-toluenesulfonic acid monohydrate (12.8384 g, 0.0644 mol, manufactured by Tokyo Chemical Industry Co., Ltd.) were added and thereto, propylene glycol monomethyl ether (113.87 g, manufactured by Kanto Chemical Co., Inc.) was further charged. The resultant mixture was stirred and the temperature of the mixture was elevated to 120° C. to dissolve the mixture, followed by initiating the polymerization. After 24 hours, the mixture was left to cool down to room temperature and was subjected to reprecipitation in methanol/pure water=80/20 (3,000 g, manufactured by Kanto Chemical Co., Inc.). The resultant precipitate was filtered and was dried with a vacuum dryer at 50° C. for 10 hours to obtain 21.08 g of the objective polymer (hereinafter, abbreviated as 4,4'-BPOH-Np2 in the present specification). The weight average molecular weight Mw of 4,4'-BPOH-Np2 measured by GPC in terms of polystyrene was 2,450 and a polydispersity Mw/Mn was 2.03. The polymer obtained in the present Synthesis Example has a structural unit of Formula (1-38).

Synthesis Example 8

In nitrogen, into a 100 mL four-neck flask, 2,2'-biphenol (7.50 g, 0.0403 mol, manufactured by Tokyo Chemical Industry Co., Ltd.), 1-naphthaldehyde (12.581 g, 0.0806 mol, manufactured by Sigma Aldrich Corp.), and methanesulfonic acid (1.5484 g, 0.0161 mol, manufactured by Tokyo Chemical Industry Co., Ltd.) were added and thereto, propylene glycol monomethyl ether (26.43 g, manufactured by Kanto Chemical Co., Inc.) was further charged. The resultant mixture was stirred and the temperature of the mixture was elevated to 120° C. to dissolve the mixture, followed by initiating the polymerization. After 24 hours, the mixture was left to cool down to room temperature and was subjected to reprecipitation in methanol (800 g, manufactured by Kanto Chemical Co., Inc.). The resultant precipitate was filtered and was dried with a vacuum dryer at 50° C. for 10 hours to obtain 5.87 g of the objective polymer (hereinafter, abbreviated as 2,2'-BPOH-Np2 in the present specification). The weight average molecular weight Mw of 2,2'-BPOH-Np2 measured by GPC in terms of polystyrene was 1,690 and a polydispersity Mw/Mn was 2.27. The polymer obtained in the present Synthesis Example has a structural unit of Formula (1-50).

Synthesis Example 9

In nitrogen, into a 200 mL four-neck flask, 4,4'-thiodiphenol (10.00 g, 0.0458 mol, manufactured by Tokyo Chemical Industry Co., Ltd.), 1-naphthaldehyde (14.311 g, 0.0916 mol, manufactured by Tokyo Chemical Industry Co., Ltd.), and methanesulfonic acid (1.7613 g, 0.0183 mol, manufactured by Kanto Chemical Co., Inc.) were added and thereto, propylene glycol monomethyl ether (31.87 g, manufactured by Kanto Chemical Co., Inc.) was further charged. The resultant mixture was stirred and the temperature of the mixture was elevated to 120° C. to dissolve the mixture, followed by initiating the polymerization. After 24 hours, the mixture was left to cool down to room temperature and was subjected to reprecipitation in methanol (1,000 g, manufactured by Kanto Chemical Co., Inc.). The resultant precipitate was filtered and was dried with a vacuum dryer at 50° C. for 10 hours and further at 120° C. for 24 hours to obtain 6.13 g of the objective polymer (hereinafter, abbreviated as TDP-Np2 in the present specification). The weight average molecular weight Mw of TDP-Np2 measured by GPC in terms of polystyrene was 1,090 and a polydispersity Mw/Mn was 1.49. The polymer obtained in the present Synthesis Example has a structural unit of Formula (1-62).

Synthesis Example 10

In nitrogen, into a 100 mL four-neck flask, 2,2'-biphenol (25.00 g, 0.1343 mol, manufactured by Tokyo Chemical Industry Co., Ltd.), 1-naphthaldehyde (10.484 g, 0.0671 mol, manufactured by Sigma Aldrich Corp.), 1-pyrenecarboxaldehyde (15.457 g, 0.0671 mol, manufactured by Tokyo Chemical Industry Co., Ltd.), and methanesulfonic acid (3.871 g, 0.0403 mol, manufactured by Tokyo Chemical Industry Co., Ltd.) were added and thereto, propylene glycol monomethyl ether (54.81 g, manufactured by Kanto Chemical Co., Inc.) was further charged. The resultant mixture was stirred and the temperature of the mixture was elevated to 120° C. to dissolve the mixture, followed by initiating the polymerization. After 24 hours, the mixture was left to cool down to room temperature and was subjected to reprecipitation in methanol (2,500 g, manufactured by Kanto Chemical Co., Inc.). The resultant precipitate was filtered and was dried with a vacuum dryer at 50° C. for 10 hours to obtain 28.02 g of the objective polymer (hereinafter, abbreviated as 2,2'-BPOH-NpPcA in the present specification). The weight average molecular weight Mw of 2,2'-BPOH-NpPcA measured by GPC in terms of polystyrene was 2,000 and a polydispersity Mw/Mn was 2.12. The polymer obtained in the present Synthesis Example is estimated to have structural units of Formulae (1-14), (1-16), (1-86), and (1-88).

Comparative Synthesis Example 1

In nitrogen, into a 100 mL four-neck flask, 1,1-bis(4-hydroxyphenyl)cyclohexane (6.00 g, 0.0224 mol, manufactured by Tokyo Chemical Industry Co., Ltd.), a formaldehyde 36% solution (1.87 g, 0.0224 mol, manufactured by Tokyo Chemical Industry Co., Ltd.), and methanesulfonic acid (0.1075 g, 0.0011 mol, manufactured by Tokyo Chemical Industry Co., Ltd.) were added and thereto, propylene glycol monomethyl ether (6.69 g, manufactured by Kanto Chemical Co., Inc.) was further charged. The resultant mixture was stirred and the temperature of the mixture was elevated to 120° C. to dissolve the mixture, followed by initiating the polymerization. After 24 hours, the mixture was left to cool down to 60° C. The mixture was diluted by adding tetrahydrofuran (13 g, manufactured by Kanto Chemical Co., Inc.) and was subjected to reprecipitation in methanol (320 g, manufactured by Kanto Chemical Co., Inc.). The resultant precipitate was filtered and was dried with a vacuum dryer at 80° C. for 24 hours to obtain 4.45 g of the objective polymer having a structural unit of Formula (3) below (hereinafter, abbreviated as BHPCH-FA in the present specification). The weight average molecular weight Mw of BHPCH-FA measured by GPC in terms of polystyrene was 10,700 and a polydispersity Mw/Mn was 3.64.

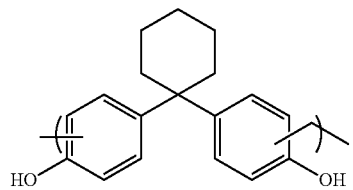

(3)

Comparative Synthesis Example 2

In nitrogen, into a 100 mL four-neck flask, carbazole (6.69 g, 0.040 mol, manufactured by Tokyo Chemical Industry Co., Ltd.), 9-fluorenone (7.28 g, 0.040 mol, manufactured by Tokyo Chemical Industry Co., Ltd.), and p-toluenesulfonic acid monohydrate (0.76 g, 0.0040 mol, manufactured by Tokyo Chemical Industry Co., Ltd.) were added and thereto, 1,4-dioxane (6.69 g, manufactured by Kanto Chemical Co., Inc.) was further charged. The resultant mixture was stirred and the temperature of the mixture was elevated to 100° C. to dissolve the mixture, followed by initiating the polymerization. After 24 hours, the mixture was left to cool down to 60° C. The mixture was diluted by adding chloroform (34 g, manufactured by Kanto Chemical Co., Inc.) and was subjected to reprecipitation in methanol (168 g, manufactured by Kanto Chemical Co., Inc.). The resultant precipitate was filtered and was dried with a vacuum dryer at 80° C. for 24 hours to obtain 9.37 g of the objective polymer having a structural unit of Formula (4) below (hereinafter, abbreviated as PCzFL in the present specification). The weight average molecular weight Mw of PCzFL measured by GPC in terms of polystyrene was 2,800 and a polydispersity Mw/Mn was 1.77.

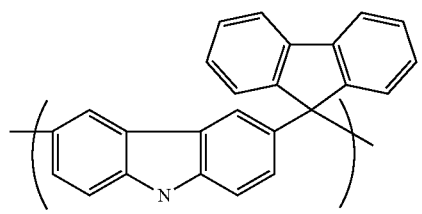

(4)

Example 1

With 20 g of the polymer obtained in Synthesis Example 1, 0.06 g of MEGAFAC R-30 (manufactured by DIC Corporation) as a surfactant was mixed, and the resultant mixture was dissolved in 80 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Example 2

With 20 g of the polymer obtained in Synthesis Example 1, 2.0 g of TMOM-BP (manufactured by Honshu Chemical Industry Co., Ltd.; 3,3',5,5'-tetramethoxymethyl-4,4'-dihydroxybiphenyl) as a cross-linking agent, 0.10 g of a thermoacid generator TAG-2689 (manufactured by King Industries, Inc.; a quaternary ammonium salt of trifluoromethanesulfonic acid) as a catalyst, and 0.06 g of MEGAFAC R-30 (manufactured by DIC Corporation) as a surfactant were mixed, and the resultant mixture was dissolved in 88 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Example 3

With 20 g of the polymer obtained in Synthesis Example 2, 0.06 g of MEGAFAC R-30 (manufactured by DIC Corporation) as a surfactant was mixed, and the resultant mixture was dissolved in 80 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Example 4

With 20 g of the polymer obtained in Synthesis Example 2, 2.0 g of TMOM-BP (manufactured by Honshu Chemical Industry Co., Ltd.; 3,3',5,5'-tetramethoxymethyl-4,4'-dihydroxybiphenyl) as a cross-linking agent, 0.10 g of a thermoacid generator TAG-2689 (manufactured by King Industries, Inc.; a quaternary ammonium salt of trifluoromethanesulfonic acid) as a catalyst, and 0.06 g of MEGAFAC R-30 (manufactured by DIC Corporation) as a surfactant were mixed, and the resultant mixture was dissolved in 88 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Example 5

With 20 g of the polymer obtained in Synthesis Example 3, 0.06 g of MEGAFAC R-30 (manufactured by DIC Corporation) as a surfactant was mixed, and the resultant mixture was dissolved in 80 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Example 6

With 20 g of the polymer obtained in Synthesis Example 3, 2.0 g of TMOM-BP (manufactured by Honshu Chemical Industry Co., Ltd.; 3,3',5,5'-tetramethoxymethyl-4,4'-dihydroxybiphenyl) as a cross-linking agent, 0.10 g of a thermoacid generator TAG-2689 (manufactured by King Industries, Inc.; a quaternary ammonium salt of trifluoromethanesulfonic acid) as a catalyst, and 0.06 g of MEGAFAC R-30 (manufactured by DIC Corporation) as a surfactant were mixed, and the resultant mixture was dissolved in 88 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Example 7

With 20 g of the polymer obtained in Synthesis Example 4, 0.06 g of MEGAFAC R-30 (manufactured by DIC Corporation) as a surfactant was mixed, and the resultant mixture was dissolved in 80 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Example 8

With 20 g of the polymer obtained in Synthesis Example 4, 2.0 g of TMOM-BP (manufactured by Honshu Chemical Industry Co., Ltd.; 3,3',5,5'-tetramethoxymethyl-4,4'-dihydroxybiphenyl) as a cross-linking agent, 0.10 g of a thermoacid generator TAG-2689 (manufactured by King Industries, Inc.; a quaternary ammonium salt of trifluoromethanesulfonic acid) as a catalyst, and 0.06 g of MEGAFAC R-30 (manufactured by DIC Corporation) as a surfactant were mixed, and the resultant mixture was dissolved in 88 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Example 9

With 20 g of the polymer obtained in Synthesis Example 5, 0.06 g of MEGAFAC R-30 (manufactured by DIC Corporation) as a surfactant was mixed, and the resultant mixture was dissolved in 80 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Example 10

With 20 g of the polymer obtained in Synthesis Example 5, 2.0 g of TMOM-BP (manufactured by Honshu Chemical Industry Co., Ltd.; 3,3',5,5'-tetramethoxymethyl-4,4'-dihydroxybiphenyl) as a cross-linking agent, 0.10 g of a thermoacid generator TAG-2689 (manufactured by King Industries, Inc.; a quaternary ammonium salt of trifluoromethanesulfonic acid) as a catalyst, and 0.06 g of MEGAFAC R-30 (manufactured by DIC Corporation) as a surfactant were mixed, and the resultant mixture was dissolved in 88 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Example 11

With 20 g of the polymer obtained in Synthesis Example 6, 0.06 g of MEGAFAC R-30 (manufactured by DIC Corporation) as a surfactant was mixed, and the resultant mixture was dissolved in 80 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Example 12

With 20 g of the polymer obtained in Synthesis Example 6, 2.0 g of TMOM-BP (manufactured by Honshu Chemical Industry Co., Ltd.; 3,3',5,5'-tetramethoxymethyl-4,4'-dihydroxybiphenyl) as a cross-linking agent, 0.10 g of a thermoacid generator TAG-2689 (manufactured by King Industries, Inc.; a quaternary ammonium salt of trifluoromethanesulfonic acid) as a catalyst, and 0.06 g of MEGAFAC R-30 (manufactured by DIC Corporation) as a surfactant were mixed, and the resultant mixture was dissolved in 88 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Example 13

With 20 g of the polymer obtained in Synthesis Example 7, 0.06 g of MEGAFAC R-30 (manufactured by DIC Corporation) as a surfactant was mixed, and the resultant mixture was dissolved in 80 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Example 14

With 20 g of the polymer obtained in Synthesis Example 7, 2.0 g of TMOM-BP (manufactured by Honshu Chemical Industry Co., Ltd.; 3,3',5,5'-tetramethoxymethyl-4,4'-dihydroxybiphenyl) as a cross-linking agent, 0.10 g of a thermoacid generator TAG-2689 (manufactured by King Industries, Inc.; a quaternary ammonium salt of trifluoromethanesulfonic acid) as a catalyst, and 0.06 g of MEGAFAC R-30 (manufactured by DIC Corporation) as a surfactant were mixed, and the resultant mixture was dissolved in 88 g of cyclohexanone to obtain a solution. Then, the solution was filtered using a polyethylene microfilter having a pore diameter of 0.10 μm and was further filtered using a polyethylene microfilter having a pore diameter of 0.05 μm

Example 15

With 20 g of the polymer obtained in Synthesis Example 8, 0.06 g of MEGAFAC R-30 (manufactured by DIC Corporation) as a surfactant was mixed, and the resultant mixture was dissolved in 80 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Example 16

With 20 g of the polymer obtained in Synthesis Example 8, 2.0 g of TMOM-BP (manufactured by Honshu Chemical Industry Co., Ltd.; 3,3',5,5'-tetramethoxymethyl-4,4'-dihydroxybiphenyl) as a cross-linking agent, 0.10 g of a thermoacid generator TAG-2689 (manufactured by King Industries, Inc.; the component is a quaternary ammonium salt of trifluoromethanesulfonic acid) as a catalyst, and 0.06 g of MEGAFAC R-30 (manufactured by DIC Corporation) as a surfactant were mixed, and the resultant mixture was dissolved in 88 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Example 17

With 20 g of the polymer obtained in Synthesis Example 9, 0.06 g of MEGAFAC R-30 (manufactured by DIC Corporation) as a surfactant was mixed, and the resultant mixture was dissolved in 80 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Example 18

With 20 g of the polymer obtained in Synthesis Example 9, 2.0 g of TMOM-BP (manufactured by Honshu Chemical Industry Co., Ltd.; 3,3',5,5'-tetramethoxymethyl-4,4'-dihydroxybiphenyl) as a cross-linking agent, 0.10 g of a thermoacid generator TAG-2689 (manufactured by King Industries, Inc.; a quaternary ammonium salt of trifluoromethanesulfonic acid) as a catalyst, and 0.06 g of MEGAFAC R-30 (manufactured by DIC Corporation) as a surfactant were mixed, and the resultant mixture was dissolved in 88 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Example 19

With 20 g of the polymer obtained in Synthesis Example 10, 0.06 g of MEGAFAC R-30 (manufactured by DIC Corporation) as a surfactant was mixed, and the resultant mixture was dissolved in 80 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Example 20

With 20 g of the polymer obtained in Synthesis Example 10, 2.0 g of TMOM-BP (manufactured by Honshu Chemical Industry Co., Ltd.; 3,3',5,5'-tetramethoxymethyl-4,4'-dihydroxybiphenyl) as a cross-linking agent, 0.10 g of a thermoacid generator TAG-2689 (manufactured by King Industries, Inc.; a quaternary ammonium salt of trifluoromethanesulfonic acid) as a catalyst, and 0.06 g of MEGAFAC R-30 (manufactured by DIC Corporation) as a surfactant were mixed, and the resultant mixture was dissolved in 88 g of cyclohexanone to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Comparative Example 1

With 20 g of a commercially available cresol novolac resin (a novolac resin obtained by using cresol and formaldehyde), 0.06 g of MEGAFAC R-30 (manufactured by DIC Corporation) as a surfactant was mixed, and the resultant mixture was dissolved in 80 g of propylene glycol monomethyl ether acetate to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process. The cresol novolac resin was used in the present Comparative Example. The weight average molecular weight Mw of the cresol novolac resin measured by GPC in terms of polystyrene was 4,000 and a polydispersity Mw/Mn was 2.1.

Comparative Example 2

With 20 g of the polymer obtained in Comparative Synthesis Example 1, 0.06 g of MEGAFAC R-30 (manufactured by DIC Corporation) as a surfactant was mixed, and the resultant mixture was dissolved in 80 g of propylene glycol monomethyl ether acetate to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

Comparative Example 3

With 20 g of the polymer obtained in Comparative Synthesis Example 2, 0.06 g of MEGAFAC R-30 (manufactured by DIC Corporation) as a surfactant was mixed, and the resultant mixture was dissolved in 80 g of propylene glycol monomethyl ether acetate to obtain a solution. Then, the solution was filtered using a polyethylene microfilter having a pore diameter of 0.10 μm and was further filtered using a polyethylene microfilter having a pore diameter of 0.05 μm to prepare a resist underlayer film forming composition to be used for a lithography process.

(Elution Test in Solvent for Photoresist)

Each of the resist underlayer film forming compositions prepared in Example 1 to Example 20 and Comparative Example 1 was applied onto a silicon wafer using a spin coater. The composition was baked on a hot plate at 400° C. for 2 minutes to form a resist underlayer film (film thickness:

0.25 μm). The resist underlayer film was immersed in ethyl lactate, propylene glycol monomethyl ether, propylene glycol monomethyl ether acetate, and cyclohexanone that are the solvent used for the resist, and it was confirmed that the resist underlayer films were insoluble in these solvents.

(Measurement of Dry Etching Rate)

Etcher and etching gas used in the measurement of dry etching rate were those described below.
Etcher: ES401 (manufactured by Nippon Scientific Co., Ltd.)
Etching gas: $CF_4$ Each of the resist underlayer film forming compositions prepared in Example 1 to Example 20, Comparative Example 1, and Comparative Example 2 was applied onto a silicon wafer using a spin coater. The composition was baked on a hot plate at 240° C. for 1 minute, or at 400° C. for 2 minutes to form a resist underlayer film (film thickness: 0.25 μm). By using a $CF_4$ gas as an etching gas, the dry etching rates of the resist underlayer films were measured. In addition, a phenol novolac resin (a commercial product, having a weight average molecular weight Mw of 2,000 that was measured by GPC in terms of polystyrene and a polydispersity Mw/Mn of 2.5) solution was applied onto a silicon wafer using a spin coater and was baked on a hot plate at 205° C. for 1 minute to form a phenol novolac resin film (film thickness: 0.25 μm). By using a $CF_4$ gas as an etching gas, the dry etching rate of the phenol novolac resin film was measured. The dry etching rate of the resist underlayer film formed from each of the resist underlayer film forming compositions prepared in Example 1 to Example 20, Comparative Example 1, and Comparative Example 2 when the dry etching rate of the phenol novolac resin film was assumed to be 1.00, was calculated as the dry etching rate ratio and the results of the calculation are shown in Table 1. A smaller dry etching rate ratio indicates a higher etching resistance against a $CF_4$ gas.

Dry etching rate ratio=(dry etching rate of resist underlayer film)/(dry etching rate of phenol novolac resin film)

TABLE 1

| | Dry etching rate ratio | |
|---|---|---|
| | Resist underlayer film (baking temperature: 240° C.) | Resist underlayer film (baking temperature: 400° C.) |
| Example 1 | 0.73 | 0.80 |
| Example 2 | 0.70 | 0.80 |
| Example 3 | 0.73 | 0.73 |
| Example 4 | 0.76 | 0.83 |
| Example 5 | 0.75 | 0.75 |
| Example 6 | 0.76 | 0.86 |
| Example 7 | 0.73 | 0.74 |
| Example 8 | 0.67 | 0.79 |
| Example 9 | 0.73 | 0.77 |
| Example 10 | 0.71 | 0.88 |
| Example 11 | 0.71 | 0.74 |
| Example 12 | 0.74 | 0.83 |
| Example 13 | 0.75 | 0.87 |
| Example 14 | 0.78 | 0.96 |
| Example 15 | 0.79 | 0.79 |
| Example 16 | 0.79 | 0.95 |
| Example 17 | 0.78 | 0.81 |
| Example 18 | 0.78 | 0.91 |
| Example 19 | 0.77 | 0.83 |
| Example 20 | 0.78 | 0.94 |
| Comparative Example 1 | 1.00 | 1.15 |
| Comparative Example 2 | 0.87 | 1.13 |

(Test for Embedding Property Relative to Hole Wafer)

Figure 21:
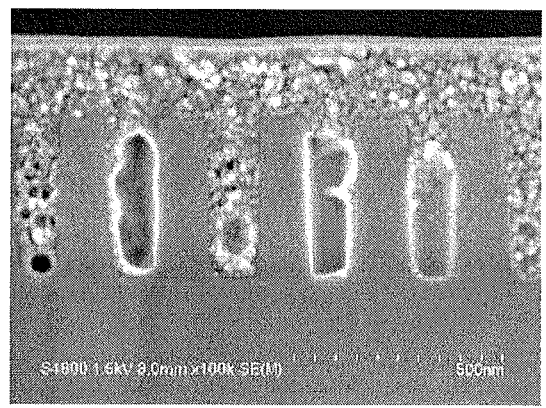
FIG. 21 is a cross-sectional SEM photograph showing a result of an embedding test using a resist underlayer film forming composition prepared in Comparative Example 3.

Each of the resist underlayer film forming compositions prepared in Example 1 to Example 20 and Comparative Example 3 was applied onto a hole wafer using a spin coater. The composition was baked on a hot plate at 400° C. for 2 minutes to form a resist underlayer film (film thickness in a part in which a hole pattern was not formed: 0.25 μm). As the hole wafer, a wafer in which a hole pattern having a diameter of 100 nm and a height of 400 nm was formed was used. Each of the resist underlayer film forming compositions prepared in Example 1 to Example 20 was applied onto the hole wafer as described above and was baked, and from the cross-sectional SEM photographs in FIG. 1 to FIG. 20 showing cross sections of the hole wafers observed under a scanning electron microscope (SEM), it was found that the inside of the hole was thoroughly filled with the resist underlayer film. In contrast, the resist underlayer film forming composition prepared in Comparative Example 3 was applied onto the hole wafer as described above and was baked, and from the cross-sectional SEM photograph in FIG. 21 showing a cross section of the hole wafer observed under a scanning electron microscope (SEM), it was found that in the inside of the hole, a cavity existed partially.

The invention claimed is:

1. A resist underlayer film forming composition comprising:
   a polymer having any one or two or more of repeating structural units of Formula (1a), Formula (1b), and Formula (1c):

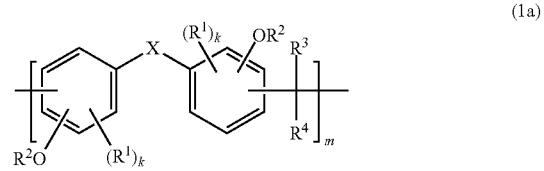

(1a)

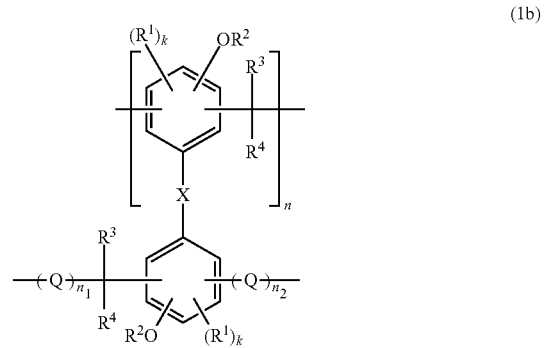

(1b)

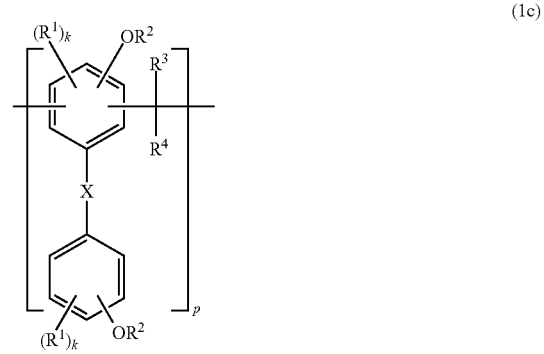

(1c)

in the formulae, two $R^1$s are each independently a $C_{1-10}$ alkyl group, a $C_{2-6}$ alkenyl group, an aromatic hydrocarbon group, a halogen atom, a nitro group, or an amino group, two $R^2$s are each independently a hydrogen atom, a $C_{1-10}$ alkyl group, a $C_{2-6}$ alkenyl group, an acetal group, an acyl group, or a glycidyl group, $R^3$ is an aromatic hydrocarbon group optionally having a substituent, $R^4$ is a hydrogen atom, a phenyl group, or a naphthyl group; in Formula (1b), groups of two $R^3$s are optionally different from each other, atoms or groups of two $R^4$s are optionally different from each other, two "k"s are each independently 0 or 1, m is an integer of 3 to 500, n, $n_1$, and $n_2$ are an integer of 2 to 500, p is an integer of 3 to 500, X is a single bond or a hetero atom, and two Qs are each independently a structural unit of Formula (2):

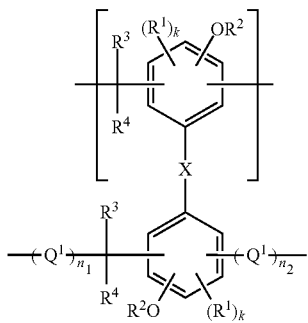

where two $R^1$s, two $R^2$s, two $R^3$s, two $R^4$s, two "k"s, $n_1$, $n_2$, and X are the same as defined in Formula (1b), and two $Q^1$s are each independently a structural unit of Formula (2); and a solvent.

2. The resist underlayer film forming composition according to claim 1, wherein
the polymer is a polymer synthesized by subjecting at least one of a biphenol compound or a bisphenol compound and at least one of an aromatic aldehyde or an aromatic ketone to a polymerization reaction in the presence of an acid catalyst.

3. The resist underlayer film forming composition according to claim 1, wherein
the aromatic hydrocarbon group of $R^3$ is a phenyl group, a naphthyl group, an anthryl group, or a pyrenyl group.

4. The resist underlayer film forming composition according to claim 1, further comprising:
at least one of a cross-linking agent, an acidic compound, a thermoacid generator, and a surfactant.

5. A production method of a semiconductor device comprising:
forming a first resist underlayer film by applying the resist underlayer film forming composition as claimed claim 1 onto a surface having a level difference, a concave part and/or a convex part and baking the composition;
forming an organopolysiloxane film as a second resist underlayer film on the first resist underlayer film;
forming a resist pattern on the second resist underlayer film;
etching the second resist underlayer film using the resist pattern as a mask;
etching the first resist underlayer film using a pattern of the etched second resist underlayer film as a mask; and
etching the surface having a level difference, a concave part and/or a convex part using a pattern of the etched first resist underlayer film as a mask.

* * * * *